US012685234B2

(12) United States Patent
Bok et al.

(10) Patent No.: US 12,685,234 B2
(45) Date of Patent: Jul. 14, 2026

(54) DISPLAY DEVICE

(71) Applicant: SAMSUNG DISPLAY CO., LTD., Yongin-si (KR)

(72) Inventors: Seung Lyong Bok, Hwaseong-si (KR); An Na Ryu, Hwaseong-si (KR); Jin Oh Kwag, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/766,489

(22) Filed: Jul. 8, 2024

(65) Prior Publication Data

US 2024/0363608 A1      Oct. 31, 2024

Related U.S. Application Data

(62) Division of application No. 17/225,466, filed on Apr. 8, 2021, now Pat. No. 12,051,682.

(30) Foreign Application Priority Data

Jun. 9, 2020      (KR) ........................ 10-2020-0069513

(51) Int. Cl.
*H10W 90/00*          (2026.01)
*G06F 3/041*          (2006.01)
(Continued)

(52) U.S. Cl.
CPC .......... *H10W 90/00* (2026.01); *G06F 3/0412* (2013.01); *G06F 3/044* (2013.01); *H10K 59/123* (2023.02);
(Continued)

(58) Field of Classification Search
None
See application file for complete search history.

(56) References Cited

U.S. PATENT DOCUMENTS

| | | | |
|---|---|---|---|
| 6,454,414 B1 | 9/2002 | Ting | |
| 10,367,123 B2 | 7/2019 | Im et al. | |

(Continued)

FOREIGN PATENT DOCUMENTS

| | | |
|---|---|---|
| CN | 109192076 A | 1/2019 |
| CN | 109599414 A | 4/2019 |

(Continued)

OTHER PUBLICATIONS

Korean Office Action for KR Application No. 10-2020-0069513, dated Dec. 12, 2024, 7 pages.

*Primary Examiner* — Christopher R Lamb
(74) *Attorney, Agent, or Firm* — Womble Bond Dickinson (US) LLP

(57)      ABSTRACT

A display device includes: a display panel including a first display area including first sub-pixels to display an image, and a second display area including second sub-pixels and a transmission area adjacent to the second sub-pixels; and an optical device overlapping the second display area of the display panel and configured to detect light incident through the transmission area. Each of the second sub-pixels includes: a first contact electrode; a second contact electrode located apart from the first contact electrode; and a light emitting element between the first contact electrode and the second contact electrode.

15 Claims, 25 Drawing Sheets

(51) Int. Cl.

| | |
|---|---|
| *G06F 3/044* | (2006.01) |
| *H10H 20/857* | (2025.01) |
| *H10K 59/123* | (2023.01) |
| *H10K 59/131* | (2023.01) |
| *H10K 59/40* | (2023.01) |
| *H10K 59/65* | (2023.01) |

(52) U.S. Cl.

CPC ........... *H10K 59/131* (2023.02); *H10K 59/40* (2023.02); *H10K 59/65* (2023.02); *H10H 20/857* (2025.01)

(56) References Cited

U.S. PATENT DOCUMENTS

| | | | |
|---|---|---|---|
| 10,580,946 | B2 | 3/2020 | Im et al. |
| 10,739,893 | B2 | 8/2020 | Park et al. |
| 10,797,212 | B2 | 10/2020 | Im et al. |
| 10,852,866 | B2 | 12/2020 | Park et al. |
| 10,944,029 | B2 | 3/2021 | Im et al. |
| 11,380,738 | B2 | 7/2022 | Zhang et al. |
| 11,462,596 | B2 | 10/2022 | Park et al. |
| 11,495,717 | B2 | 11/2022 | Im et al. |
| 11,830,966 | B2 | 11/2023 | Im et al. |
| 2017/0262109 | A1 | 9/2017 | Choi et al. |
| 2018/0089485 | A1 | 3/2018 | Bok |
| 2018/0129328 | A1 | 5/2018 | Park et al. |
| 2018/0138157 | A1 | 5/2018 | Im et al. |
| 2019/0115513 | A1 | 4/2019 | Im et al. |
| 2019/0179462 | A1* | 6/2019 | Ting ...................... G06F 1/1658 |
| 2020/0126472 | A1 | 4/2020 | Tang et al. |
| 2020/0251538 | A1 | 8/2020 | Zhang et al. |
| 2020/0312237 | A1* | 10/2020 | He ...................... G09G 3/3225 |
| 2021/0143229 | A1 | 5/2021 | Feng |
| 2023/0066918 | A1 | 3/2023 | Im et al. |
| 2024/0097083 | A1 | 3/2024 | Im et al. |

FOREIGN PATENT DOCUMENTS

| | | | |
|---|---|---|---|
| CN | 109949711 | A | 6/2019 |
| KR | 2017-0106621 | A | 9/2017 |
| KR | 10-2017-0113066 | A | 10/2017 |
| KR | 2018-0050473 | A | 5/2018 |
| KR | 2018-0055021 | A | 5/2018 |
| KR | 2019-0042130 | A | 4/2019 |
| KR | 10-2020-0017013 | A | 2/2020 |
| KR | 2020-0015474 | A | 2/2020 |
| WO | WO 2018/191551 | A1 | 10/2018 |

* cited by examiner

Figure 15:
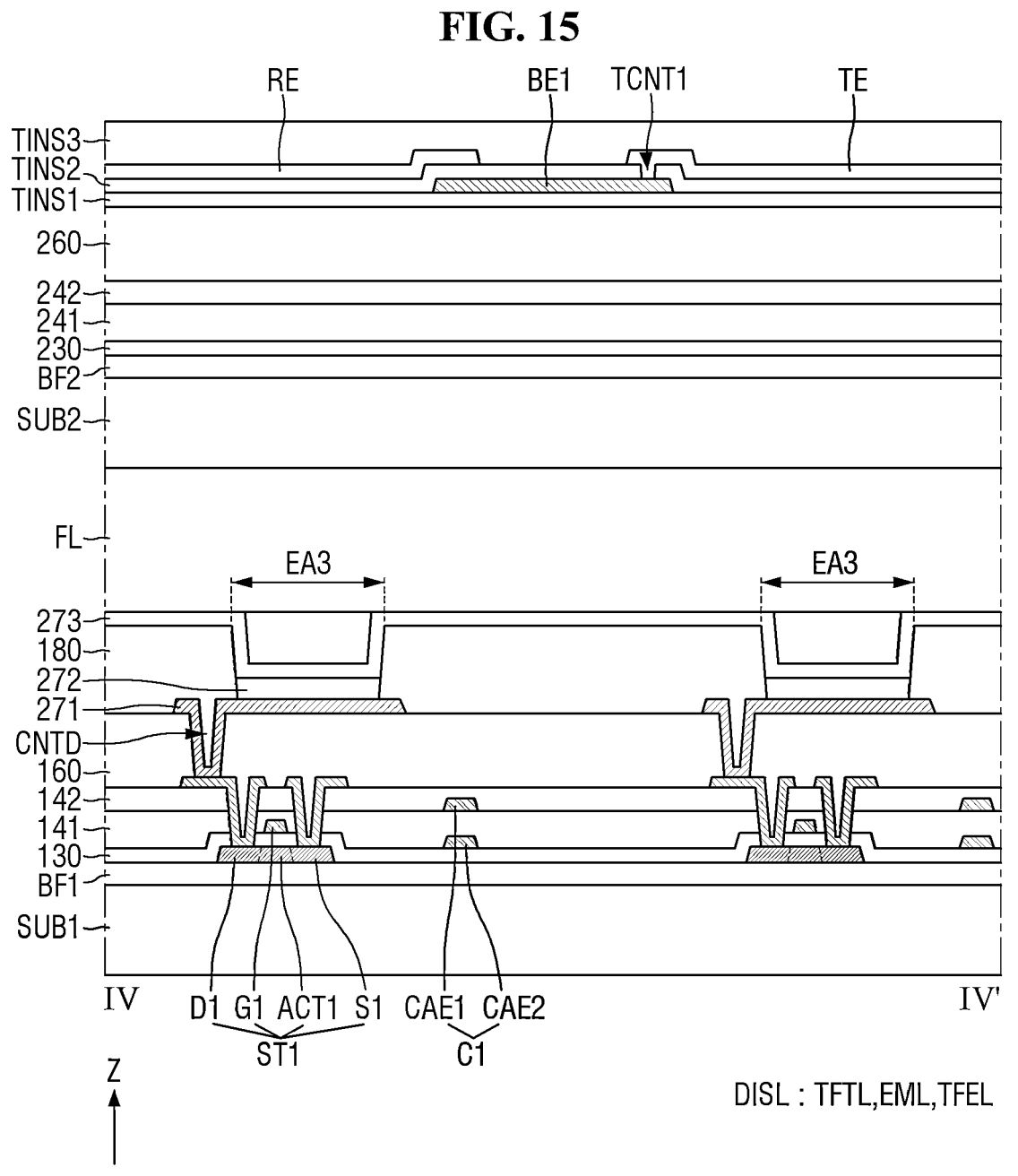

RE        BE1   TCNT1       TE

TINS3

TINS2

TINS1

260

242

241

230

BF2

SUB2

FL

EA3            EA3

273

180

272

271

CNTD

160

142

141

130

BF1

SUB1

IV    D1   G1   ACT1   S1   CAE1   CAE2        IV'

ST1       C1

Z

DISL : TFTL,EML,TFEL

FIG. 16

DISL : TFTL,EML,TFEL

10

DISPLAY DEVICE

CROSS-REFERENCE TO RELATED APPLICATIONS

This divisional application claims priority to and the benefit of U.S. patent application Ser. No. 17/225,466, filed on Apr. 8, 2021, which claims priority to and the benefit of Korean Patent Application No. 10-2020-0069513, filed on Jun. 9, 2020 in the Korean Intellectual Property Office (KIPO), the entire contents of which are incorporated by reference herein.

BACKGROUND

1. Field

Aspects of embodiments of the present invention relate to a display device.

2. Description of the Related Art

With the development of information society, requirements for display devices for displaying images have increased in various forms. For example, display devices are applied to various electronic appliances, such as smartphones, digital cameras, notebook computers, navigators, and smart televisions.

A display device may include a display panel including a plurality of pixels connected to scan lines, data lines, and power lines to display an image. Further, the display device may include various optical devices, such as an image sensor for photographing an image on a front surface of the display device, a proximity sensor for detecting whether a user is located close to the front surface of the display device, an illuminance sensor for detecting the illuminance of the front surface of the display device, and an iris sensor for recognizing a user's iris.

The optical device may be provided in a hole formed in the front surface of the display device, the hole not overlapping the display panel. As display devices are applied to various electronic devices, display devices having various designs are needed. For example, in the case of a smartphone, there is a demand for a display device capable of widening a display area by omitting a hole formed in the front surface of the display device. However, in a case in which optical devices are arranged to overlap the display panel, the optical devices are covered by pixels of the display panel, scan lines, data lines, and power lines, and, thus, light incident on the optical devices may be reduced. Thus, the function of the optical device may be deteriorated.

SUMMARY

According to an aspect of some embodiments of the present disclosure, a display device which can prevent or substantially prevent light incident on an optical device from being reduced even when the optical device is disposed to overlap a display panel is provided.

However, embodiments of the present disclosure are not limited to those set forth herein. The above and other aspects of embodiments of the present disclosure will become more apparent to one of ordinary skill in the art to which the present disclosure pertains by referencing the detailed description of the present disclosure given below.

According to one or more embodiments of the present disclosure, a display device comprises: a display panel including a first display area including first sub-pixels to display an image, and a second display area including second sub-pixels and a transmission area adjacent to the second sub-pixels; and an optical device overlapping the second display area of the display panel and configured to detect light incident through the transmission area. Each of the second sub-pixels includes: a first contact electrode; a second contact electrode located apart from the first contact electrode; and a light emitting element between the first contact electrode and the second contact electrode.

According to one or more embodiments of the present disclosure, a display device comprises: a display panel including a first display area including first sub-pixels to display an image, and a second display area including second sub-pixels and a transmission area adjacent to the second sub-pixels; and an optical device overlapping the second display area of the display panel and configured to detect light incident through the transmission area. Each of the first sub-pixels includes a first light emitting electrode, a second light emitting electrode on the first light emitting electrode, and a light emitting layer between the first light emitting electrode and the second light emitting electrode, and each of the second sub-pixels includes a first contact electrode, a second contact electrode located apart from the first contact electrode, and a light emitting element between the first contact electrode and the second contact electrode.

According to one or more embodiments of the present disclosure, a display device comprises: a first substrate; a first thin film transistor on the first substrate and including a first gate electrode, a first source electrode, and a first drain electrode; a second thin film transistor on the first substrate and including a second gate electrode, a second source electrode, and a second drain electrode; a first electrode electrically connected to the first source electrode or first drain electrode of the first thin film transistor; a light emitting layer on the first electrode; a second electrode on the light emitting layer; an encapsulation layer on the second electrode; a sensor electrode on the encapsulation layer; a first alignment electrode electrically connected to the second source electrode or second drain electrode of the second thin film transistor; and a second light emitting element electrically connected to the first alignment electrode. The sensor electrode and the first alignment electrode are made of a same material.

According to the aforementioned and other example embodiments of the present disclosure, since the second display area includes pixels and a transmission area, when optical devices are arranged on a back surface of the second display area of a display panel, light incident on a front surface of the display panel may be incident on the optical devices through the transmission areas.

According to the aforementioned and other example embodiments of the present disclosure, a number of light emitting elements of the pixel in the second display area may be greater than a number of light emitting elements of the pixel in the first display area. In this case, a maximum luminance of the pixels in the second display area may be higher than a maximum luminance of the pixels in the first display area. Accordingly, a difference between the maximum luminance of the first display area and the maximum luminance of the second display area due to the transmission area can be minimized or reduced.

According to the aforementioned and other example embodiments of the present disclosure, when the area of the pixel in the second display area is reduced, the area of the transmission area may be increased. Therefore, the amount of light incident on the optical devices arranged on the back surface of the second display area of the display panel through the transmission areas can be increased. Thus, optical sensing of the optical devices may be improved.

According to the aforementioned and other example embodiments of the present disclosure, when the first alignment electrode and the second alignment electrode are disposed on a same layer as the sensing electrodes and the driving electrodes and are made of a same material as the sensing electrodes and the driving electrodes, the first alignment electrode, the second alignment electrode, the sensing electrodes, and the driving electrodes may be formed by one mask process. Therefore, any one of the mask process for forming the first alignment electrode and the second alignment electrode and the mask process for forming the sensing electrodes and the driving electrodes can be omitted, thereby reducing a manufacturing cost.

According to the aforementioned and other example embodiments of the present disclosure, when the sensor electrode is disposed on a same layer as the second contact electrode and is made of a same material as the second contact electrode, the sensor electrode and the second contact electrode can be formed by one mask process. Therefore, any one of the mask process for forming the sensor electrode and the mask process for forming the second contact electrode can be omitted, thereby reducing a manufacturing cost.

BRIEF DESCRIPTION OF THE DRAWINGS

The above and other aspects and features of the present disclosure will become more apparent by describing some example embodiments thereof with reference to the attached drawings, in which:

FIG. 6 is an example view illustrating a light emitting element according to an embodiment;

FIG. 9 is a cross-sectional view illustrating an example of a display panel taken along the lines I-I' and II-II' of FIG. 7;

FIG. 15 is a cross-sectional view illustrating another example of a display panel taken along the line IV-IV' of FIG. 13;

FIG. 16 is a cross-sectional view illustrating an example of a display panel taken along the lines V-V' and VI-VI' of FIG. 14;

DETAILED DESCRIPTION

Figure 1:
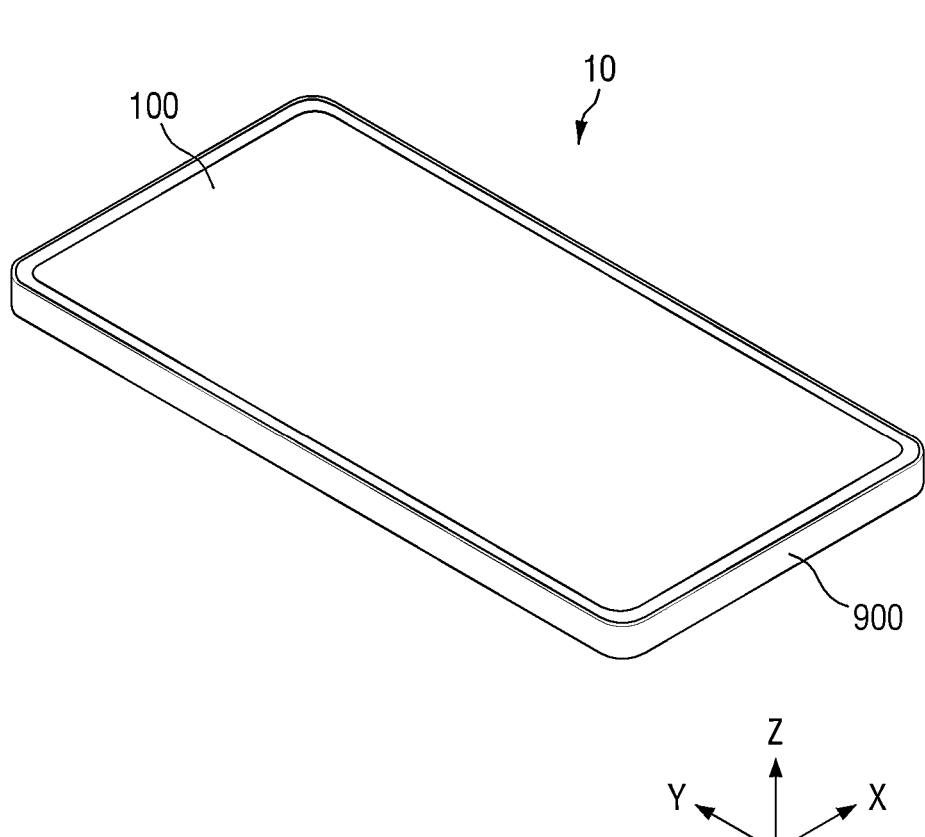
FIG. 1 is a perspective view of a display device according to an embodiment.

The present disclosure will now be described more fully herein with reference to the accompanying drawings, in which some example embodiments of the disclosure are shown. This disclosure may, however, be embodied in different forms and should not be construed as being limited to the embodiments set forth herein. Rather, these embodiments are provided so that this disclosure will be thorough and complete, and will fully convey the scope of the disclosure to those skilled in the art. The same reference numbers indicate the same or like components throughout the specification. In the attached figures, the thicknesses of layers and regions may be exaggerated for clarity.

Herein, the use of the term "may," when describing embodiments of the present disclosure, refers to "one or more embodiments of the present disclosure." As used herein, the term "and/or" includes any and all combinations of one or more of the associated listed items. As used herein, the singular forms "a," "an," and "the" are intended to include the plural forms as well, unless the context clearly indicates otherwise. As used herein, expressions such as "at least one of," "one of," and "selected from," when preceding a list of elements, modify the entire list of elements and do not modify the individual elements of the list.

It is to be understood that when an element or layer is referred to as being "on," "connected to," "coupled to," or "adjacent to" another element or layer, it may be directly on, connected to, coupled to, or adjacent to the other element or layer, or one or more intervening elements or layers may be present. In contrast, when an element or layer is referred to as being "directly on," "directly connected to," "directly coupled to," or "immediately adjacent to" another element or layer, there are no intervening elements or layers present. As used herein, the terms "substantially," "about," and similar terms are used as terms of approximation and not as terms of degree, and are intended to account for the inherent deviations in measured or calculated values that would be recognized by those of ordinary skill in the art.

As used herein, phrases such as "a plan view" may refer to a view from top or from a direction normal to the display area of the display device.

Spatially relative terms, such as "beneath," "below," "lower," "above," "upper," "bottom," "top," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (e.g., rotated 90 degrees or at other orientations), and the spatially relative descriptors used herein should be interpreted accordingly.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Unless otherwise defined, all terms (including technical and scientific terms) used herein have the same meaning as commonly understood by one of ordinary skill in the art to which the present disclosure belongs. It is to be further understood that terms, such as those defined in commonly used dictionaries, should be interpreted as having a meaning that is consistent with their meaning in the context of the relevant art and/or the present disclosure, and should not be interpreted in an idealized or overly formal sense, unless expressly so defined herein.

Herein, some example embodiments of the present disclosure will be described with reference to the attached drawings.

Figure 2:
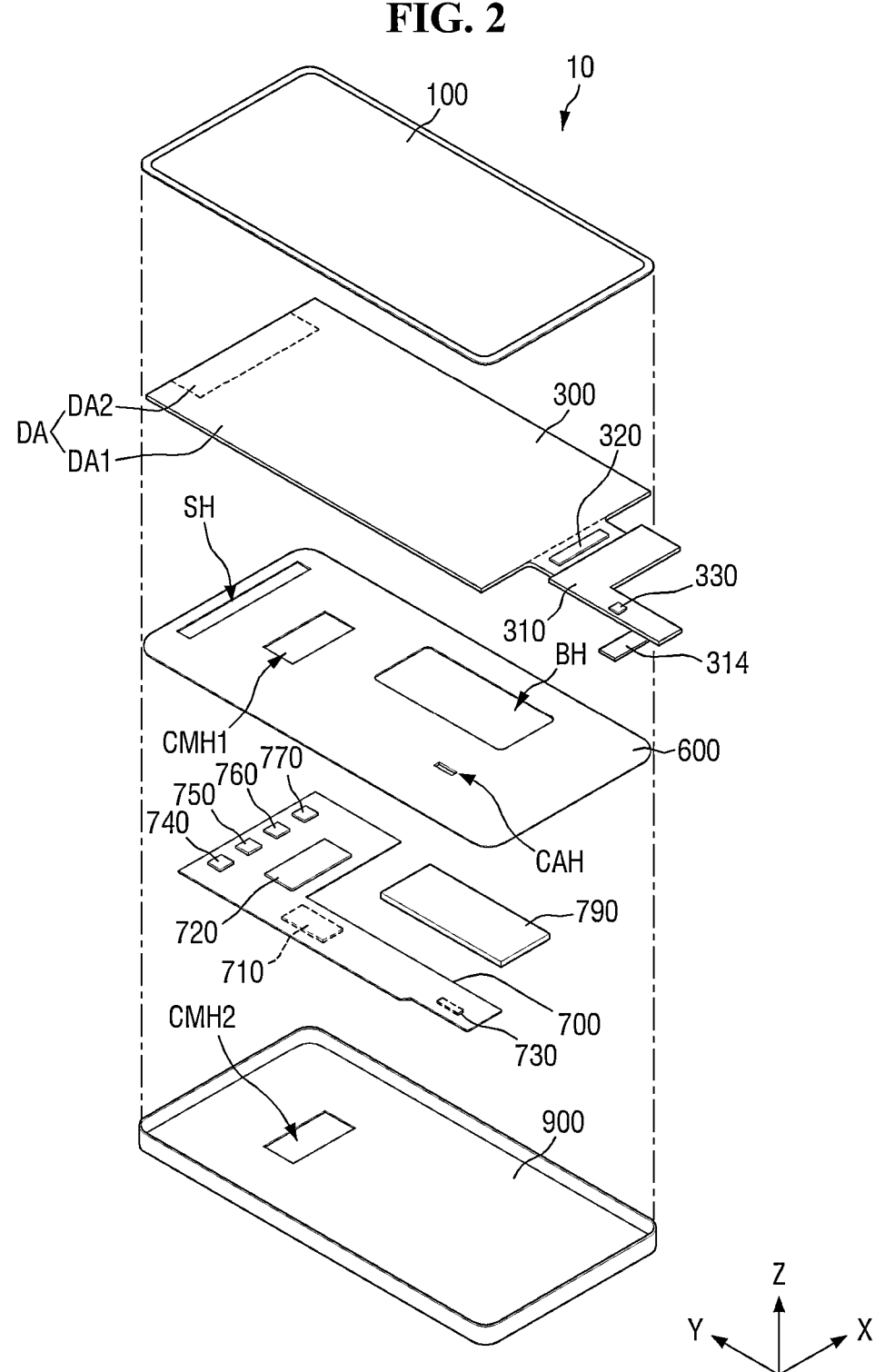
FIG. 2 is an exploded perspective view of a display device according to an embodiment.

FIG. 1 is a perspective view of a display device according to an embodiment; and FIG. 2 is an exploded perspective view of a display device according to an embodiment.

Referring to FIGS. 1 and 2, a display device 10 according to an embodiment may be applied to a portable electronic appliance, such as a mobile phone, a smartphone, a tablet personal computer (tablet PC), a mobile communication terminal, an electronic notebook, an e-book, a portable multimedia player (PMP), a navigator, or an ultra-mobile PC (UMPC). Alternatively, the display device 10 according to an embodiment may be applied to a display unit of a television, a notebook, a monitor, a billboard, or internet of things (IoT). Alternatively, the display device 10 according to an embodiment may be applied to a wearable device, such as a smart watch, a watch phone, an eyeglass display, or a head mounted display (HMD). Alternatively, the display device 10 according to an embodiment may be applied to a center information display placed in a car instrument panel, a car center fascia or a carbon dashboard, a room mirror display replacing a car side mirror, or a display placed on a back surface of a front seat as an entertainment device for a back seat of a car.

In this specification, a first direction (X-axis direction) is a direction parallel to short sides of the display device 10, for example, and may be a horizontal direction of the display device 10. A second direction (Y-axis direction) is a direction parallel to long sides of the display device 10, for example, and may be a vertical direction of the display device 10. A third direction (Z-axis direction) may be a thickness direction of the display device 10.

In an embodiment, the display device 10 may have a planar shape similar to a rectangular shape. For example, as shown in FIG. 1, the display device 10 may have a planar shape similar to a rectangular planar shape having short sides in the first direction (X-axis direction) and long sides in the second direction (Y-axis direction). An edge where the short side in the first direction (X-axis direction) meets the long side in the second direction (Y-axis direction) may be formed to have a rounded shape of a curvature (e.g., a predetermined curvature) or have a right angle shape. However, the planar shape of the display device 10 is not limited to a rectangular shape, and may be formed in another polygonal shape, circular shape, or elliptical shape.

In an embodiment, the display device 10 may be formed flat. In another embodiment, the display device 10 may be formed such that two sides facing each other are bent. For example, the display device 10 may be formed such that left and right sides are bent. Alternatively, the display device 10 may be formed such that upper, lower, left, and right sides are all bent.

The display device 10 according to an embodiment includes a cover window 100, a display panel 300, a display circuit board 310, a display driving circuit 320, a bracket 600, a main circuit board 700, optical devices 740, 750, 760, and 770, and a lower cover 900.

The cover window 100 may be disposed on a front surface of the display panel 300 so as to cover the front surface of the display panel 300. Thus, the cover window 100 may protect the front surface of the display panel 300. In an embodiment, the cover window 100 may be attached to the front surface of the display panel 300 using a transparent adhesive member.

The cover window 100 is made of a transparent material, and, in an embodiment, may include glass or plastic. For example, when the cover window 100 includes glass, the cover window 100 may include ultra-thin glass (UTG) having a thickness of 0.1 mm or less. In an embodiment, when the cover window includes plastic, the cover window 100 may include a transparent polyimide film.

The display panel 300 may include a display area DA including a first display area DA1 and a second display area DA2. The first display area DA1 includes pixels for displaying an image, and does not include a transmission area for transmitting light. In contrast, the second display area DA2 may include not only pixels for displaying an image, but also a transmission area for transmitting light. Therefore, the light transmittance of the second display area DA2 may be higher than that of the first display area DA1.

The second display area DA2 may overlap the optical devices 740, 750, 760, and 770 in the third direction (Z-axis direction). Therefore, light passing through the second display area DA2 may be incident on the optical devices 740, 750, 760, and 770. Thus, each of the optical devices 740, 750, 760, and 770 may detect light incident from the front surface of the display device 10 even though it is disposed to overlap the display panel 300.

The display panel 300 may be a light emitting display panel including a light emitting element. For example, the display panel 300 may be an organic light emitting display panel using an organic light emitting diode including an organic light emitting layer, an ultra-small LED display panel using micro LED or nano LED, a quantum dot light emitting display panel using a quantum dot light emitting diode including a quantum dot light emitting layer, or an inorganic light emitting display panel using an inorganic light emitting diode including an inorganic semiconductor.

The first display area DA1 and the second display area DA2 may include the same light emitting element or different light emitting elements from each other. For example, both the first display area DA1 and the second display area DA2 may include micro LEDs or nano LEDs. In an embodiment, the first display area DA1 includes an organic light emitting diode, and the second display area DA2 may include a micro LED or nano LED.

The display circuit board 310 and the display driving circuit 320 may be attached to a side of the display panel 300. The display circuit board 310 may be a flexible printed circuit board that may be bent, a rigid printed circuit board that is not easily bent due to rigidity, or a composite printed circuit board including both the rigid printed circuit board and the flexible printed circuit board.

The display driving circuit 320 may receive control signals and power voltages, and may generate and output signals and voltages for driving the display panel 300. In an embodiment, the display driving circuit 320 may be formed as an integrated circuit (IC). The display driving circuit 320 may be attached onto the display panel 300 by a chip on glass (COG) method, a chip on plastic (COP) method, or an ultrasonic bonding method, but the present invention is not limited thereto. For example, the display driving circuit 320 may be attached onto the display circuit board 310.

In an embodiment, a touch driving circuit 330 may be disposed on the display circuit board 310. The touch driving circuit 330 may be formed as an integrated circuit, and may be attached to a surface of the display circuit board 310. The touch driving circuit 330 may be electrically connected to touch electrodes of a touch sensor layer of the display panel 300 through the display circuit board 310. The touch driving circuit 330 may output touch driving signals to the touch electrodes, and may sense voltages charged in the capacitances of the touch electrodes.

The touch driving circuit 330 may generate touch data according to a change in the electrical signal sensed at each of the sensor electrodes and transmit the touch data to a main processor 710, and the main processor 710 may analyze the touch data to calculate touch coordinates where a touch has occurred. The touch may include a contact touch and a proximity touch. The contact touch indicates that an object, such as a human finger or a pen, is in direct contact with the cover window 100 disposed on the sensor electrode layer. The proximity touch indicates that, like hovering, an object, such as a human finger or a pen, is located close to the cover window 100.

In an embodiment, a power supply unit for supplying display driving voltages for driving the display driving circuit 320 may be additionally disposed on the display circuit board 310.

The bracket 600 may be disposed under the display panel 300. The bracket 600 may include a plastic, a metal, or both a plastic and a metal. In an embodiment, the bracket 600 may be provided with a first camera hole CMH1 into which a first camera sensor 720 is inserted, a battery hole BH in which a battery is disposed, a cable hole CAH through which a cable 314 connected to the display circuit board 310 passes, and a light transmitting hole SH in which the optical devices 740, 750, 760, and 770 are disposed. In another embodiment, the bracket 600 may be formed not to overlap the second display area DA2 of the display panel 300 instead of including the light transmitting hole SH.

The main circuit board 700 and a battery 790 may be disposed under the bracket 600. The main circuit board 700 may be a printed circuit board or a flexible printed circuit board.

The main circuit board 700 may include the main processor 710, the first camera sensor 720, a main connector 730, and the optical devices 740, 750, 760, 770. In an embodiment, the optical devices 740, 750, 760, and 770 may include a proximity sensor 740, an illuminance sensor 750, an iris sensor 760, and a second camera sensor 770.

In an embodiment, the first camera sensor 720 may be disposed on the front and back surfaces of the main circuit board 700, the main processor 710 may be disposed on the front surface of the main circuit board 700, and the main connector 730 may be disposed on the back surface of the main circuit board 700. The proximity sensor 740, the illuminance sensor 750, the iris sensor 760, and the second camera sensor 770 may be disposed on the front surface of the main circuit board 700.

The main processor 710 may control all of the functions of the display device 10. For example, the main processor 710 may output digital video data to the display driving unit 320 through the display circuit board 310 such that the display panel 300 displays an image. Further, the main processor 710 may receive touch data from the touch driving unit 330, determine a user's touch coordinates, and then execute an application indicated by an icon displayed on the user's touch coordinates. Further, the main processor 710 may convert first image data input from the first camera sensor 720 into digital video data and output the digital video data to the display driving circuit 320 through the display circuit board 310, thereby displaying an image photographed by the first camera sensor 720 on the display panel 300. Further, the main processor 710 may control the display device 10 according to sensor signals input from the proximity sensor 740, the illuminance sensor 750, the iris sensor 760, and the second camera sensor 770.

The main processor 710 may determine whether an object is located close to the front surface of the display device 10 according to the proximity sensor signal input from the proximity sensor 740. When an object is located close to the front surface of the display device 10 in a call mode in which a user speaks with another party using the display device 10, the main processor 710 may not execute an application indicated by an icon displayed on the user's touch coordinates even if the touch is executed by the user.

The main processor 710 may determine the brightness of the front surface of the display device 10 according to the illuminance sensor signal input from the illuminance sensor 750. The main processor 710 may adjust the luminance of an image displayed by the display panel 300 according to the brightness of the front surface of the display device 10.

The main processor 710 may determine whether an iris image of a user is the same as the iris image previously stored in the memory according to an iris sensor signal input from the iris sensor 760. When the iris image of the user is the same as the iris image previously stored in the memory, the main processor 710 may unlock the display device 10 and display a home screen on the display panel 300.

The main processor 710 may generate digital video data according to the second image data input from the second camera sensor 770. The main processor 710 may output the digital video data to the display driving circuit 320 through the display circuit board 310, thereby displaying an image photographed by the second camera sensor 770.

The first camera sensor 720 processes an image frame such as a still image or a moving image obtained by the image sensor and outputs the processed image frame to the main processor 710. In an embodiment, the first camera sensor 720 may be a CMOS image sensor or a CCD sensor. The first camera sensor 720 may be exposed to a back surface of the lower cover 900 by a second camera hole CMH2, and thus an object or background disposed under the display device 10 may be photographed.

The cable 314 having passed through the cable hole CAH of the bracket 600 may be connected to the main connector 730. Thus, the main circuit board 700 may be electrically connected to the display circuit board 310.

The proximity sensor 740 is a sensor for detecting whether an object is located close to the front surface of the display device 10. In an embodiment, the proximity sensor 740 may include a light source that outputs light and a light receiver that receives light reflected by an object. The proximity sensor 740 may determine whether an object located close to the front surface of the display device 10 exists according to an amount of light reflected by the object. Since the proximity sensor 740 is disposed to overlap the light transmitting hole SH, the second display area DA2 of the display panel 300, and a light transmitting portion of the cover window 100 in the third direction (Z-axis direction), the proximity sensor 740 may generate a proximity sensor signal according to whether an object located close to the front surface of the display device 10 exists, and may output the proximity sensor signal to the main processor 710.

The illuminance sensor 750 is a sensor for detecting the brightness of the front surface of the display device 10. In an embodiment, the illuminance sensor 750 may include a resistor having a resistance value that changes according to a brightness of incident light. The illuminance sensor 750 may determine the brightness of the front surface of the display device 10 according to the resistance value of the resistor. Since the illuminance sensor 750 is disposed to overlap the light transmitting hole SH, the second display area DA2 of the display panel 300, and the light transmitting portion of the cover window 100 in the third direction (Z-axis direction), the illuminance sensor 750 may generate an illuminance sensor signal according to the brightness of the front surface of the display device 10, and may output the illuminance sensor signal to the main processor 710.

The iris sensor 760 is a sensor for detecting whether an image of a user's iris is the same as an iris image previously stored in the memory. Since the iris sensor 760 is disposed to overlap the light transmitting hole SH, the second display area DA2 of the display panel 300, and the light transmitting portion of the cover window 100 in the third direction (Z-axis direction), a user's iris disposed on the display device 10 may be photographed. The iris sensor 760 may generate an iris sensor signal according to whether an image of the user's iris is the same as the iris image previously stored in the memory, and may output the iris sensor signal to the main processor 710.

The second camera sensor 770 processes an image frame such as a still image or a moving image obtained by the image sensor and output the processed image frame to the main processor 710. In an embodiment, the second camera sensor 770 may be a CMOS image sensor or a CCD sensor. A number of pixels in the second camera sensor 770 may be smaller than a number of pixels in the first camera sensor 720, and the size of the second camera sensor 770 may be smaller than the size of the first camera sensor 720. Since the second camera sensor 770 is disposed to overlap the light transmitting hole SH, the second display area DA2 of the display panel 300, and the light transmitting portion of the cover window 100 in the third direction (Z-axis direction), the second camera sensor 770 may photograph an object or background disposed on the display device 10.

In an embodiment, the battery 790 may be disposed so as not to overlap the main circuit board 700 in the third direction (Z-axis direction). The battery 790 may overlap the battery hole BH of the bracket 600.

In an embodiment, the main circuit board 700 may be further provided with a mobile communication module capable of transmitting and receiving radio signals with at least one of a base station, an external terminal, and a server on a mobile communication network. The radio signals may include any of various types of data according to transmission and reception of a voice call signal, a video call signal, or a text/multimedia message.

The lower cover 900 may be disposed under the main circuit board 700 and the battery 790. The lower cover 900 may be engaged and fixed to the bracket 600. The lower cover 900 may form a back surface appearance of the display device 10. In an embodiment, the lower cover 900 may include a plastic, a metal, or both a plastic and a metal.

The lower cover 900 may be provided with the second camera hole CMH2 through which a back surface of the first camera sensor 720 is exposed. However, the position of the first camera sensor 720 and the positions of the first and second camera holes CMH1 and CMH2 corresponding to the first camera sensor 720 are not limited to the example embodiment shown in FIG. 2.

Figure 3:
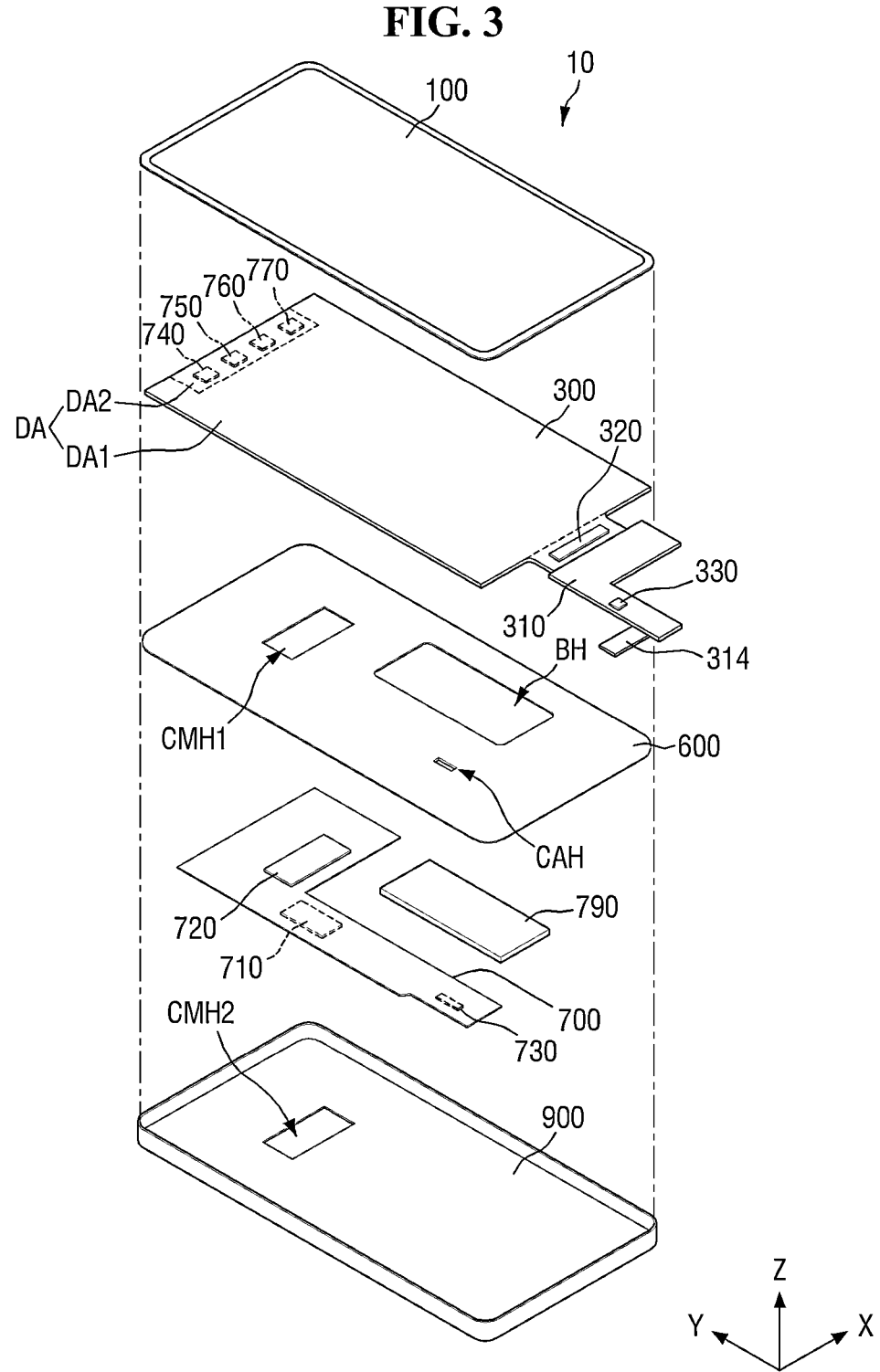
FIG. 3 is an exploded perspective view of a display device according to another embodiment.

FIG. 3 is an exploded perspective view of a display device according to another embodiment.

The embodiment of FIG. 3 is different from the embodiment of FIG. 2 in that the optical devices 740, 750, 760, and 770 are attached to the back surface of the display panel 300. In FIG. 3, differences from the embodiment of FIG. 2 will be mainly described.

Referring to FIG. 3, in an embodiment, each of the proximity sensor 740, the illuminance sensor 750, the iris sensor 760, and the second camera sensor 770 may be attached to a rear surface of the display panel 300 using a transparent adhesive member. In this case, the bracket 600 may not include the light transmitting hole SH.

Figure 4A:
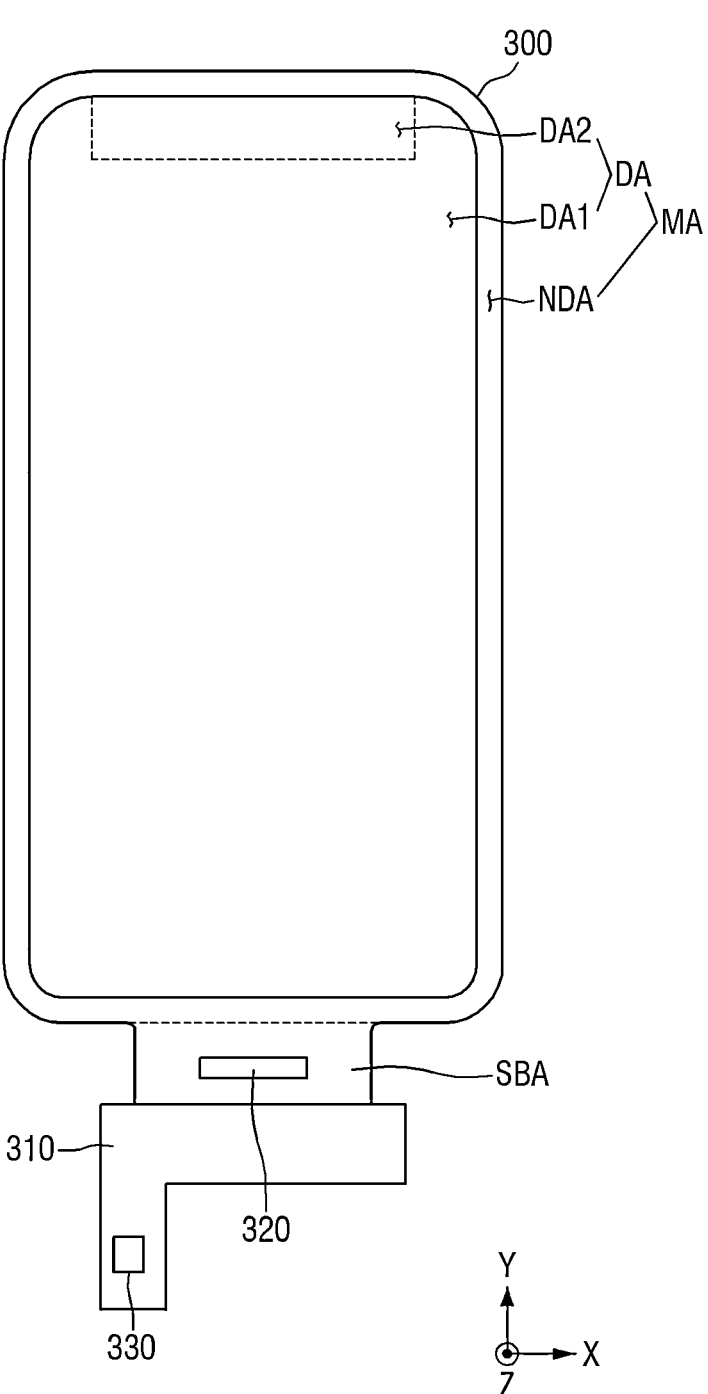
FIG. 4A is a view illustrating a display panel, a display circuit board, a display driving circuit, and a touch driving circuit according to an embodiment.

FIG. 4A is a view illustrating a display panel, a display circuit board, a display driving circuit, and a touch driving circuit according to an embodiment.

Referring to FIG. 4A, the display panel 300 may be a rigid display panel that is not easily bent due to rigidity, or a flexible display panel that is easily bent, folded, or rolled due to flexibility. For example, the display panel 300 may be a foldable display panel that can be folded and unfolded, a curved display panel in which a display surface is curved, a bent display panel in which an area other than the display surface is bent, a rollable display device that can be rolled and unrolled, or a stretchable display panel that can be stretched.

The display panel 300 may include a main area MA and a sub-area SBA protruding from a side of the main area MA. The main area MA may include a display area DA displaying an image and a non-display area NDA that is an area peripheral to the display area DA. The display area DA may occupy most of the main area MA. In an embodiment, the display area DA may be disposed at the center of the main area MA, and the non-display area NDA may be an area outside the display area DA. In an embodiment, the non-display area NDA may be disposed to surround the display area DA. The non-display area NDA may be defined as an edge area of the display panel 300.

The display area DA may include a first display area DA1 and a second display area DA2. The first display area DA1 may occupy most of the display area DA. The second display area DA2 may be at least partially surrounded by the first display area DA1. The second display area DA2 may be disposed on at least a part of an edge of the display panel 300. For example, the second display area DA2 may be disposed on at least a part of an upper edge, a lower edge, a left edge, or a right edge of the display panel 300, but the present invention is not limited thereto.

In an embodiment, the second display area DA2 may have a rectangular planar shape. When the second display area DA2 is disposed on at least a part of the upper edge or lower edge of the display panel 300, the length of the second display area DA2 in the first direction (X-axis direction) may be longer than the length of the second display area DA2 in the second direction (Y-axis direction). In another embodiment, when the second display area DA2 is disposed on at least a part of the left edge or right edge of the display panel 300, the length of the second display area DA2 in the second direction (Y-axis direction) may be longer than the length of the second display area DA2 in the first direction (X-axis direction).

The sub-area SBA may protrude from a side of the main area MA in the second direction (Y-axis direction). The length of the sub-area SBA in the second direction (Y-axis direction) may be smaller than the length of the main area MA in the second direction (Y-axis direction). The length of the sub-area SBA in the first direction (X-axis direction) may be smaller than the length of the main area MA in the first direction (X-axis direction), or may be substantially the same as the length of the main area MA in the first direction (X-axis direction). The sub-area SBA may be bent, and may be disposed on the back surface of the substrate SUB. In this case, the sub-area SBA may overlap the main area MA in the third direction (Z-axis direction).

The display circuit board 310 and the display driving circuit 320 may be attached to the sub-area SBA of the display panel 300. In an embodiment, the display circuit board 310 may be attached to pads of the sub-area SBA of the display panel 300 using a low-resistance and high-reliability material such as an anisotropic conductive film or a self-assembly anisotropic conductive paste (SAP).

Figure 4B:
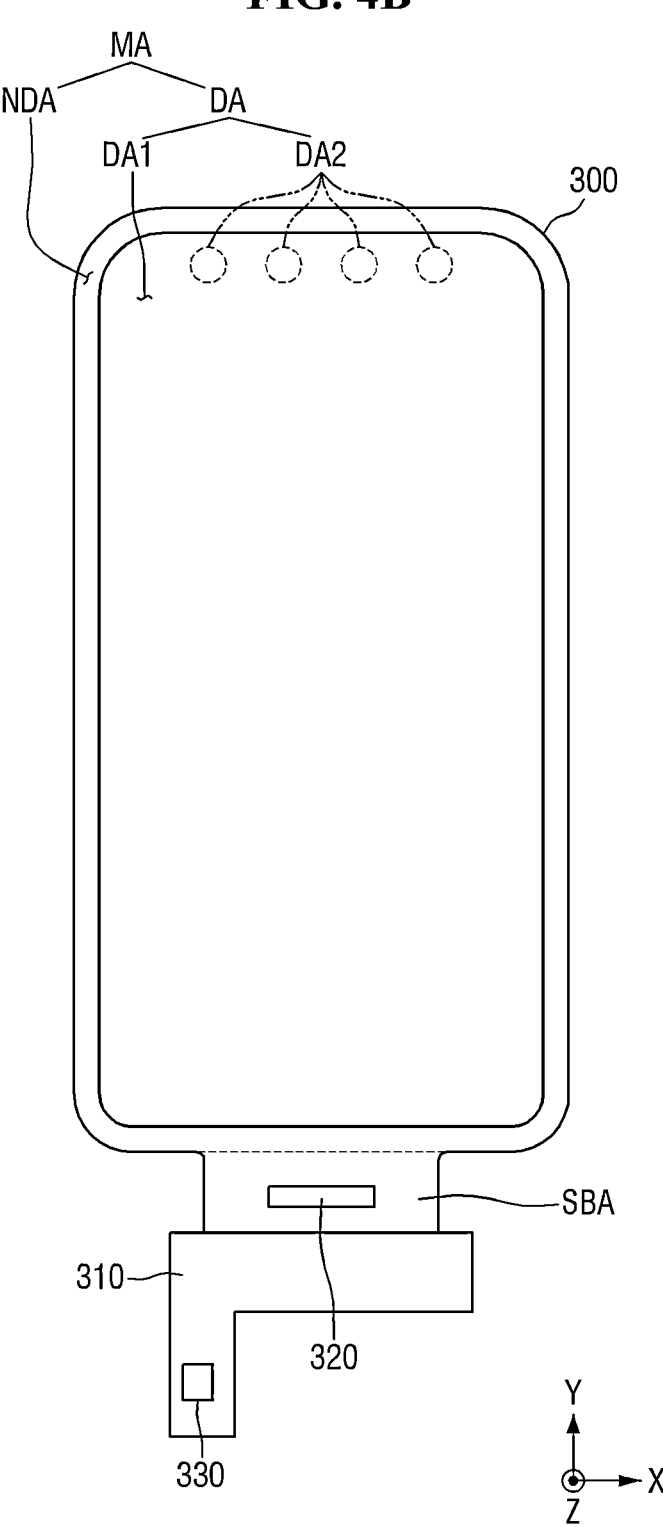
FIG. 4B is a view illustrating a display panel, a display circuit board, a display driving circuit, and a touch driving circuit according to another embodiment.

FIG. 4B is a view illustrating a display panel, a display circuit board, a display driving circuit, and a touch driving circuit according to another embodiment.

The embodiment of FIG. 4B is different from the embodiment of FIG. 4A in that the display panel includes a plurality of second display areas DA2. In FIG. 4B, differences from the embodiment of FIG. 4A will be mainly described.

Referring to FIG. 4B, the second display areas DA2 may be arranged to be spaced apart from each other. When the second display areas DA2 are arranged on at least a part of the upper edge or lower edge of the display panel 300, the second display areas DA2 may be arranged in the first direction (X-axis direction). When the second display areas DA2 are arranged on at least a part of the left edge or right edge of the display panel 300, the second display areas DA2 may be arranged in the second direction (Y-axis direction). In an embodiment, each of the second display areas DA2 may be completely surrounded by the first display area DA1.

The second display areas DA2 may overlap the optical devices 740, 750, 760, and 770 in the third direction (Z-axis direction), respectively. For example, one of the second display areas DA2 may overlap the proximity sensor 740 in the third direction (Z-axis direction), another of the second display areas DA2 may overlap the illuminance sensor 750 in the third direction (Z-axis direction), another of the second display areas DA2 may overlap the iris sensor 760 in the third direction (Z-axis direction), and another of the second display areas DA2 may overlap the second camera sensor 770 in the third direction (Z-axis direction). The proximity sensor 740, the illuminance sensor 750, the iris sensor 760, and the second camera sensor 770 may detect light incident from the front surface of the display device 10 through the second display areas DA2.

Although it is illustrated in FIG. 4B that the display area DA includes four second display areas DA2, the present invention is not limited thereto. The number of the second display areas DA2 may depend on the number of optical devices 740, 750, 760, and 770. For example, the second display areas DA2 may be disposed to correspond one-to-one with the optical devices 740, 750, 760, and 770.

Although it is illustrated in FIG. 4B that the second display areas DA2 have a circular planar shape, the present invention is not limited thereto. For example, each of the second display areas DA2 may have a polygonal or elliptical planar shape. As shown in FIG. 4B, the second display areas DA2 may have a same size as one another, but the present invention is not limited thereto. The second display areas DA2 may have different sizes from each other.

Figure 5:
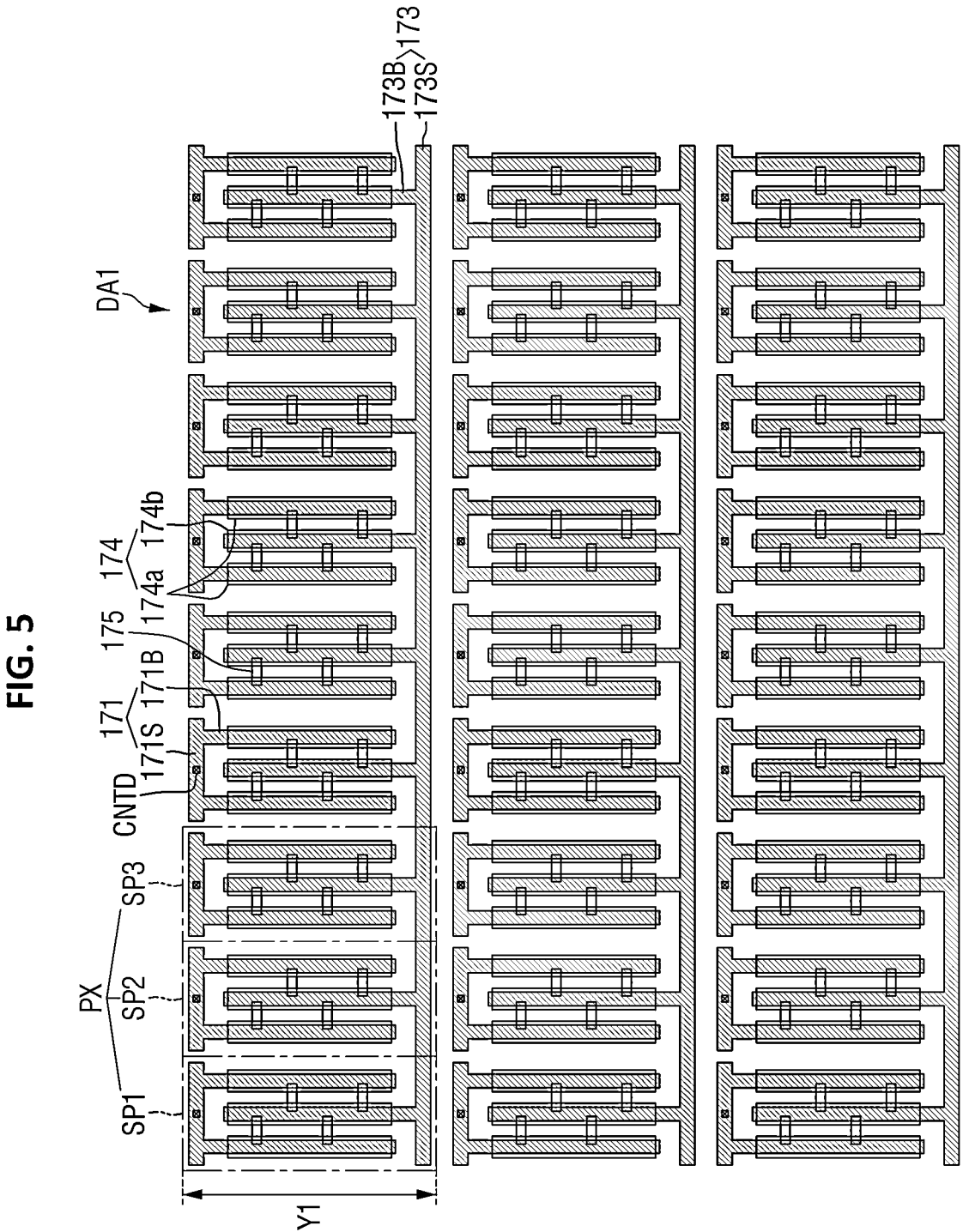
FIG. 5 is a layout view illustrating a first display area of a display panel according to an embodiment.

FIG. 5 is a layout view illustrating a first display area of a display panel according to an embodiment.

Referring to FIG. 5, the first display area DA1 may include pixels PX including a first sub-pixel SP1, a second sub-pixel SP2, and a third sub-pixel SP3. The first sub-pixel SP1 may include a light emitting element 175 that emits first light, the second sub-pixel SP2 may include a light emitting element 175 that emits second light, and the third sub-pixel SP3 may include a light emitting element 175 that emits third light.

In the first display area DA1, the first sub-pixels SP1, the second sub-pixels SP2, and the third sub-pixels SP3 may be alternately arranged in the first direction (X-axis direction). The first sub-pixels SP1 may be arranged in parallel in the second direction (Y-axis direction), the second sub-pixels SP2 may be arranged in parallel in the second direction (Y-axis direction), and the third sub-pixels SP3 may be arranged in parallel in the second direction (Y-axis direction).

Each of the first sub-pixels SP1, the second sub-pixels SP2, and the third sub-pixels SP3 may include a first alignment electrode 171, a second alignment electrode 173, a contact electrode 174, and light emitting elements 175.

The first alignment electrode 171 is a pixel electrode separated or spaced apart for each of the sub-pixels SP1, SP2, and SP3, and the second alignment electrode 173 may be a common electrode commonly connected to the sub-pixels SP1, SP2, and SP3. One of the first alignment electrode 171 and the second alignment electrode 173 may be an anode electrode of the light emitting element 175 and the other of the first alignment electrode 171 and the second alignment electrode 173 may be a cathode electrode of the light emitting element 175.

The first alignment electrode 171 may include a first electrode stem portion 171S and at least one first electrode branch portion 171B branched from the first electrode stem portion 171S and extending in the second direction (Y-axis direction).

The first electrode stem portion 171S of one sub-pixel of the sub-pixels SP1, SP2, and SP3 may be electrically separated from the first electrode stem portion 171S of another sub-pixel adjacent to the one sub-pixel in the first direction (X-axis direction). The first electrode stem portion 171S of any one sub-pixel may be disposed to be spaced apart from the first electrode stem portion 171S of another sub-pixel adjacent to the one sub-pixel in the first direction (X-axis direction). In an embodiment, the first electrode stem part 171S may be connected to a source electrode or a drain electrode of a first thin film transistor through a first electrode contact hole CNTD.

The first electrode branch portion 171B may be disposed to be spaced apart from another first electrode branch portion 171B in the first direction (X-axis direction). At least one second electrode branch portion 173B of the second alignment electrode 173 may be disposed between adjacent first electrode branch portions 171B in the first direction (X-axis direction).

The second alignment electrode 173 may include a second electrode stem portion 173S extending in the first direction (X-axis direction) and a second electrode branch portion 173B branched from the second electrode stem portion 173S and extending in the second direction (Y-axis direction).

The second electrode stem portion 173S of one sub-pixel of the sub-pixels SP1, SP2, and SP3 may be connected to the second electrode stem portion 173S of another sub-pixel adjacent to the one sub-pixel in the first direction (X-axis direction). The second electrode stem portion 173S may be disposed to cross the sub-pixels SP1, SP2, and SP3 in the first direction (X-axis direction).

The second electrode branch portion 173B may be disposed to be spaced apart from the first electrode branch portion 171B in the first direction (X-axis direction). The second electrode branch portion 173B may be disposed between the first electrode branch portions 171B in the first direction (X-axis direction).

Although it is illustrated in FIG. 5 that the first electrode branch portion 171B and the second electrode branch portion 173B extend in the second direction (Y-axis direction), the present invention is not limited thereto. For example, each of the first electrode branch portion 171B and the second electrode branch portion 173B may have a partially curved or bent shape. In another embodiment, one electrode of the first electrode branch portion 171B and the second electrode branch portion 173B may be disposed to surround the other electrode thereof. For example, the second electrode branch portion 173B may have a circular planar shape and be disposed to surround the first electrode branch portion 171B, and an annular hole may be formed between the first electrode branch portion 171B and the second electrode branch portion 173B. That is, when the first electrode branch portion 171B and the second electrode branch portion 173B are spaced apart from each other and a space for providing the light emitting element 175 is formed between the first electrode branch portion 171B and the second electrode branch portion 173B, each of the first electrode branch portion 171B and the second electrode branch portion 173B may be formed to have any suitable shape.

The contact electrode 174 may include a first contact electrode 174a and a second contact electrode 174b. The first contact electrode 174a and the second contact electrode 174b may extend in the second direction (Y-axis direction).

The first contact electrode 174a may be disposed on the first electrode branch portion 171B and may be in contact with the first electrode branch portion 171B. The first contact electrode 174a may be in contact with one end of the light emitting element 175. The first contact electrode 174a may be disposed between the first electrode branch portion 171B and the light emitting element 175. Accordingly, the light emitting element 175 may be electrically connected to the first alignment electrode 171 through the first contact electrode 174a.

The second contact electrode 174b may be disposed on the second electrode branch portion 173B and may be in contact with the second electrode branch portion 173B. The second contact electrode 174b may be in contact with the other end of the light emitting element 175. The second contact electrode 174b may be disposed between the second electrode branch portion 173B and the light emitting element 175. Accordingly, the light emitting element 175 may be electrically connected to the second alignment electrode 173 through the second contact electrode 174b.

In an embodiment, the width of the first contact electrode 174a (or the length of the first contact electrode 174a in the first direction (X-axis direction)) may be greater than the width of the first electrode branch portion 171B (or the length of the first electrode branch portion 171B in the first direction (X-axis direction)), and the width of the second contact electrode 174b (or the length of the second contact electrode 174b in the first direction (X-axis direction)) may be greater than the width of the second electrode branch portion 173B (or the length of the second electrode branch portion 173B in the first direction (X-axis direction)).

Each of the light emitting elements 175 may be disposed between the first contact electrode 174a and the second contact electrode 174b. One end of each of the light emitting elements 175 may be in contact with the first contact electrode 174a, and the other end thereof may be in contact with the second contact electrode 174b.

The plurality of light emitting elements 175 may be arranged to be spaced apart from each other. In an embodiment, the plurality of light emitting elements 175 may be substantially aligned in parallel with each other. The plurality of light emitting elements 175 may be arranged in the second direction (Y-axis direction).

The light emitting element 175 may have a shape of a rod, wire, tube, or the like. For example, the light emitting element 175 may have a cylindrical shape or a rod shape. In another embodiment, the light emitting element 175 may have a polyhedron shape, such as a cube or a cuboid, or a polygonal column shape, such as a hexagonal column. In another embodiment, the light emitting element 175 may have a truncated cone shape extending in a direction and having a partially inclined outer surface. In an embodiment, the length of the light emitting element 175 may be in a range of 1 $\mu$m to 10 $\mu$m or 2 $\mu$m to 6 $\mu$m, and, in an embodiment, in a range of 3 $\mu$m to 5 $\mu$m. In an embodiment, the diameter of the light emitting element 175 may be in a range of 300 nm to 700 nm, and the aspect ratio of the light emitting element 175 may be 1.2 to 100.

Each of the light emitting elements 175 of the first sub-pixel SP1 may emit a first light, each of the light emitting elements 175 of the second sub-pixel SP2 may emit a second light, and each of the light emitting elements 175 of the third sub-pixel SP3 may emit a third light. In an embodiment, the first light may be red light having a center wavelength band of 620 nm to 752 nm, the second light may be green light having a center wavelength band of 495 nm to 570 nm, and the third light may be blue light having a center wavelength band of 450 nm to 495 nm. In another embodiment, the light emitting element 175 of the first sub-pixel SP1, the light emitting element 175 of the second sub-pixel SP2, and the light emitting element 175 of the third sub-pixel SP3 may emit light of a same or substantially same color.

Figure 6:
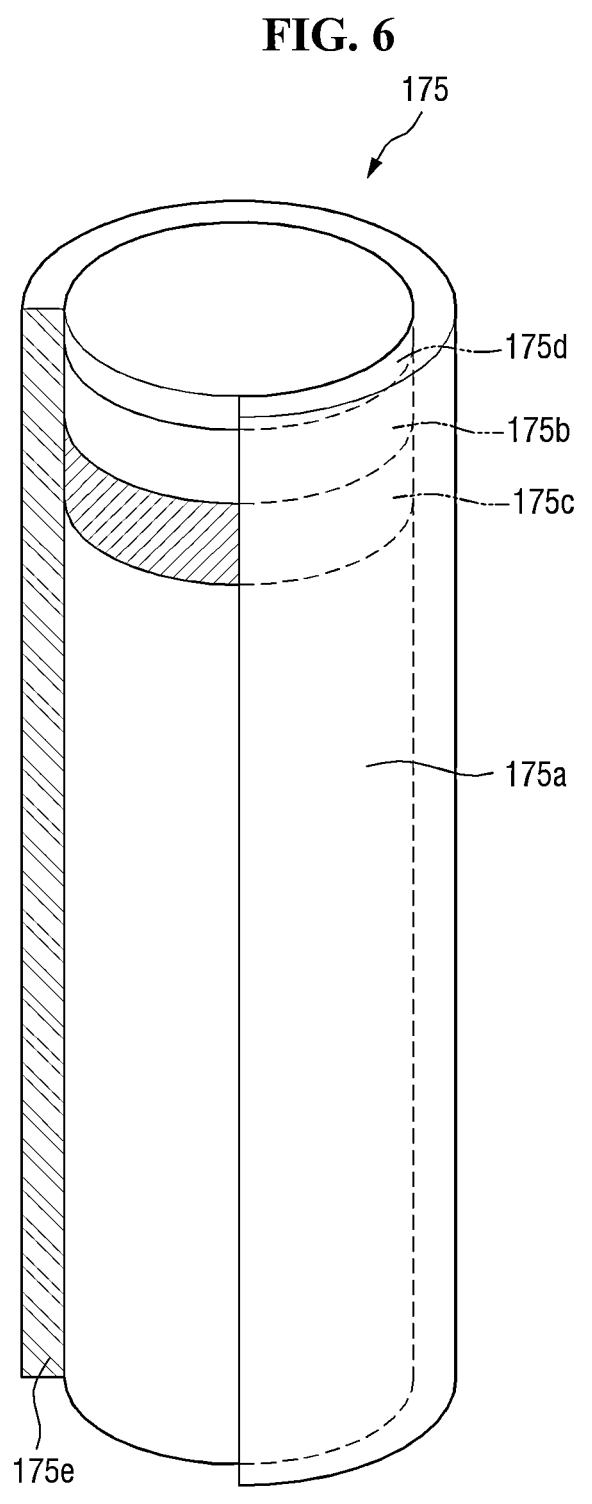

FIG. 6 is an example view illustrating a light emitting element according to an embodiment.

Referring to FIG. 6, in an embodiment, the light emitting element 175 may include a first semiconductor layer 175a, a second semiconductor layer 175*b*, an active layer 175*c*, an electrode layer 175*d*, and an insulating film 175*e*.

The first semiconductor layer 175*a* may include, for example, an n-type semiconductor having a first conductivity type. In an embodiment, the first semiconductor layer 175*a* may include at least one of AlGaInN, GaN, AlGaN, InGaN, AlN, and InN, which are doped with an n-type dopant. For example, when the light emitting element 175 emits light in the blue wavelength band, the first semiconductor layer 175*a* may include a semiconductor material having the formula AlxGayIn1-*x*-yN (0≤x≤1, 0≤y≤1, 0≤x+y≤1). The first semiconductor layer 175*a* may be doped with a first conductivity type dopant, such as Si, Ge, or Sn. For example, the first semiconductor layer 175*a* may include n-GaN doped with n-type Si.

The second semiconductor layer 175*b* may include, for example, a p-type semiconductor having a second conductivity type. In an embodiment, the second semiconductor layer 175*b* may include at least one of AlGaInN, GaN, AlGaN, InGaN, AlN, and InN, which are doped with a p-type dopant. For example, when the light emitting element 175 emits light in the blue or green wavelength band, the second semiconductor layer 175*b* may include a semiconductor material having the formula AlxGayIn1-*x*-yN (0≤x≤1, 0≤y≤1, 0≤x+y≤1). The second semiconductor layer 175*b* may be doped with a second conductivity type dopant, such as Mg, Zn, Ca, Se, or Ba. In an embodiment, the second semiconductor layer 175*b* may include p-GaN doped with p-type Mg.

The active layer 175*c* is disposed between the first semiconductor layer 175*a* and the second semiconductor layer 175*b*. The active layer 175*c* may include a material having a single or multiple quantum well structure. When the active layer 175*c* includes a material having a multiple quantum well structure, the active layer 175*c* may have a structure in which a plurality of quantum layers and a plurality of well layers are alternately stacked. In another embodiment, the active layer 175*c* may have a structure in which a semiconductor material having a large band gap energy and a semiconductor material having a small band gap energy are alternately stacked, and may include Group 3 to 5 semiconductor materials according to the wavelength band of emitted light.

The active layer 175*c* may emit light by the combination of electron-hole pairs according to electrical signals applied through the first semiconductor layer 175*a* and the second semiconductor layer 175*b*. The light emitted by the active layer 175*c* is not limited to light in the blue wavelength band, but may emit light in the red and green wavelength bands. For example, when the active layer 175*c* emits light in the blue wavelength band, the active layer 175*c* may include a material such as AlGaN or AlGaInN. In an embodiment, when the active layer 175*c* is a multiple quantum well structure in which quantum layers and well layers are alternately stacked, the quantum layer may include a material such as AlGaN or AlGaInN, and the well layer may include a material such as GaN or AlInN. For example, the active layer 175*c* may include a quantum layer containing AlGaInN and a well layer containing AlInN, as described above, and the active layer 175*c* may emit blue light having a central wavelength band ranging from 450 nm to 495 nm.

The light emitted from the active layer 175*c* may be emitted to both side surfaces as well as a longitudinal outer surface of the light emitting element 175. That is, the light emitted from the active layer 175*c* is not limited to one direction.

In an embodiment, the electrode layer 175*d* may be an ohmic contact electrode or a Schottky contact electrode. The light emitting element 175 may include at least one electrode layer 175*d*. When the light emitting element 175 is electrically connected to the first alignment electrode 171 or the second alignment electrode 173, due to the electrode layer 175*d*, a resistance between the light emitting element 175 and the first alignment electrode 171 or the second alignment electrode 173 may be reduced. In an embodiment, the electrode layer 175*d* may include at least one conductive metal material selected from aluminum (Al), titanium (Ti), indium (In), gold (Au), silver (Ag), indium tin oxide (ITO), indium zinc oxide (IZO), and indium tin-zinc oxide (ITZO). Further, the electrode layer 175*d* may include a semiconductor material doped with an n-type or a p-type dopant. The electrode layer 175*d* may include a same material or different materials, but the present invention is not limited thereto.

In an embodiment, the insulating film 175*e* is disposed to surround the outer surfaces of the first semiconductor layer 175*a*, the second semiconductor layer 175*b*, the active layer 175*c*, and the electrode layer 175*d*. The insulating film 175*e* protects the first semiconductor layer 175*a*, the second semiconductor layer 175*b*, the active layer 175*c*, and the electrode layer 175*d*. The insulating film 175*e* may be formed to expose both ends of the light emitting element 175 in the length direction. That is, one end of the first semiconductor layer 175*a* and one end of the electrode layer 175*d* may be exposed without being covered by the insulating film 175*e*. In an embodiment, the insulating film 175*e* may cover a part of the outer surface of the first semiconductor layer 175*a* and a part of the outer surface of the second semiconductor layer 175*b* in addition to the active layer 175*c*, or may cover a part of the outer surface of the electrode layer 175*d* in addition to the active layer 175*c*.

The insulating film 175*e* may include any of materials having insulating properties, for example, silicon oxide (SiOx), silicon nitride (SiNx), silicon oxynitride (SiOxNy), aluminum nitride (AlN), and aluminum oxide (A$_2$O$_3$). The insulating film 175*e* may prevent or substantially prevent an electrical short that may occur when the active layer 175*c* is in direct contact with the first alignment electrode 171 and the second alignment electrode 173 transmitting electrical signals to the light emitting element 175. Further, since the insulating film 175*e* protects the outer surface of the light emitting elements 175 in addition to the active layer 175*c*, the insulating film 175*e* may prevent or substantially prevent a decrease in light emission efficiency.

Figure 7:
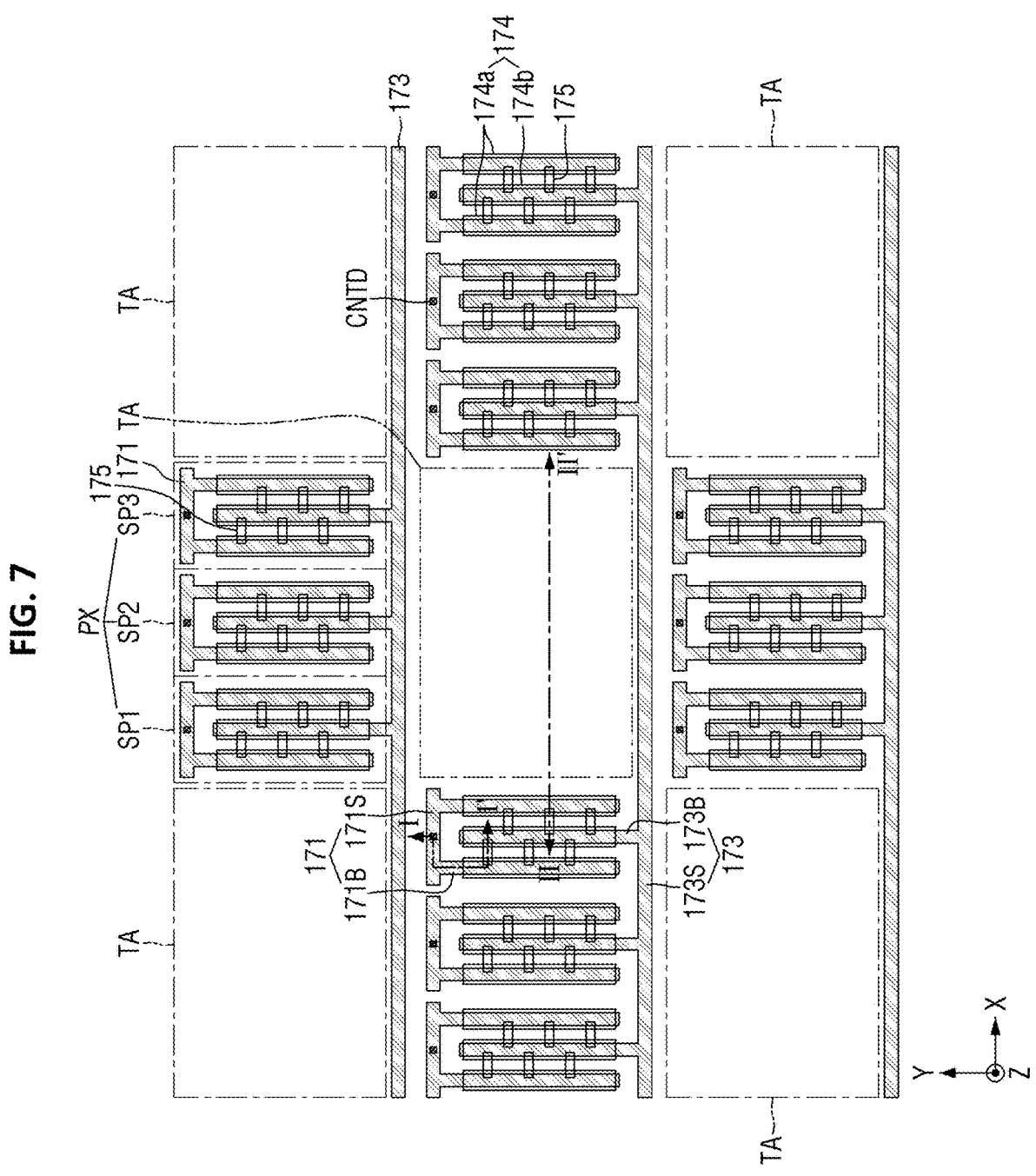
FIG. 7 is a layout view illustrating a second display area of a display panel according to an embodiment.

FIG. 7 is a layout view illustrating a second display area of a display panel according to an embodiment.

Referring to FIG. 7, the second display area DA2 may include pixels PX and transmission areas TA.

Each of the pixels PX may include a first sub-pixel SP1, a second sub-pixel SP2, and a third sub-pixel SP3. Since the first sub-pixels SP1, the second sub-pixels SP2, and the third sub-pixels SP3 may be substantially the same as those described with reference to FIG. 5, further descriptions thereof will be omitted.

The transmission areas TA are areas through which light incident on the display panel 300 passes. In an embodiment, the transmission areas TA may be surrounded by pixels PX. In an embodiment, in the first direction (X-axis direction) and the second direction (Y-axis direction), the transmission areas TA and the pixels PX may be alternately arranged. For example, the transmission areas TA and the pixels PX may be alternately arranged in the first direction (X-axis direction) and the second direction (Y-axis direction). Even when the optical devices 740, 750, 760, and 770 are arranged on the back surface of the display panel 300, light incident on the front surface of the display panel 300 is transmitted to the optical devices 740, 750, 760, and 770 through the transmission areas TA.

Since the second display area DA2 is provided with the transmission areas TA, a number (for example, pixels per inch (PPI)) of sub-pixels SP1, SP2, and SP3 per unit area in the second display area DA2 may be smaller than the number of sub-pixels SP1, SP2, and SP3 per unit area in the first display area DA1. The unit area may be an area (e.g., a predetermined area) for calculating the number of pixels. For example, the unit area may be an area of a rectangular area corresponding to 1 inch in the first direction (X-axis direction) and 1 inch in the second direction (Y-axis direction) on a plane. Since the number of sub-pixels SP1, SP2, and SP3 per unit area in the second display area DA2 is smaller than the number of sub-pixels SP1, SP2, and SP3 per unit area in the first display area DA1, the maximum luminance of the second display area DA2 may be lower than the maximum luminance of the first display area DA1.

In an embodiment, a number of the light emitting elements 175 in the pixel PX of the second display area DA2 may be larger than the number of light emitting elements 175 in the pixel PX of the first display area DA1. For example, a number of the light emitting elements 175 in each of the sub-pixels SP1, SP2, and SP3 of the second display area DA2 may be larger than a number of the light emitting elements 175 in each of the sub-pixels SP1, SP2, and SP3 of the first display area DA1. In this case, the maximum luminance of the pixel PX of the second display area DA2 may be higher than the maximum luminance of the pixel PX of the first display area DA1. Therefore, a difference between the maximum luminance of the second display area DA2 and the maximum luminance of the first display area DA1 may be minimized or reduced.

Figure 8:
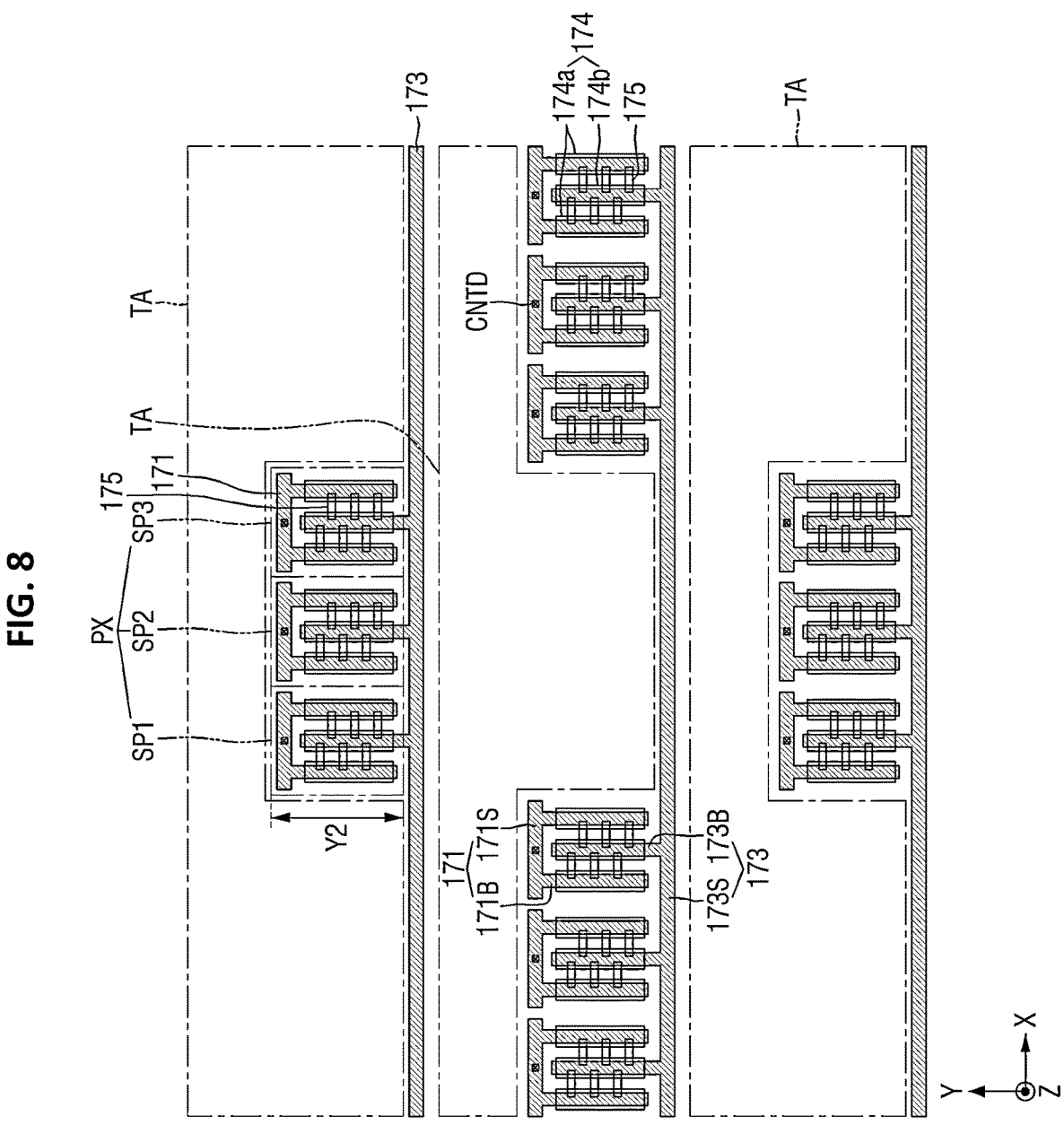
FIG. 8 is a layout view illustrating a second display area of a display panel according to another embodiment.

FIG. 8 is a layout view illustrating a second display area of a display panel according to another embodiment.

The embodiment of FIG. 8 is different from the embodiment of FIG. 7 in that an area of the pixel PX of the second display area DA2 is different from an area of the pixel PX of the first display area DA1. In FIG. 8, differences from the embodiment of FIG. 7 will be mainly described.

Referring to FIG. 8, the area of the pixel PX of the second display area DA2 may be smaller than the area of the pixel PX of the first display area DA1. The area of each of the sub-pixels SP1, SP2, and SP3 of the second display area DA2 may be smaller than the area of each of the sub-pixels SP1, SP2, and SP3 of the first display area DA1.

A length of the pixel PX of the second display area DA2 in a direction may be smaller than a length of the pixel PX of the first display area DA1 in a direction. For example, a length Y2 of the pixel PX of the second display area DA2 in the second direction (Y-axis direction) may be smaller than a length Y1 of the pixel PX of the first display area DA1 in the second direction (Y-axis direction). In an embodiment, the length Y2 of each of the sub-pixels SP1, SP2, and SP3 of the second display area DA2 in the second direction (Y-axis direction) may be smaller than the length Y1 of each of the sub-pixels SP1, SP2, and SP3 of the first display area DA1 in the second direction (Y-axis direction).

In another embodiment, a length of the pixel PX of the second display area DA2 in the first direction (X-axis direction) may be smaller than a length of the pixel PX of the first display area DA1 in the first direction (X-axis direction). The length of each of the sub-pixels SP1, SP2, and SP3 of the second display area DA2 in the first direction (X-axis direction) may be smaller than the length of each of the sub-pixels SP1, SP2, and SP3 of the first display area DA1 in the first direction (X-axis direction).

When the length of the pixel PX of the second display area DA2 in a direction is smaller than the length of the pixel PX of the first display area DA1 in a direction, the transmission area TA may extend in the other direction. For example, when the length Y2 of the pixel PX of the second display area DA2 in the second direction (Y-axis direction) is smaller than the length Y1 of the pixel PX of the first display area DA1 in the second direction (Y-axis direction), the transmission area TA may extend in the first direction (X-axis direction).

As shown in FIG. 8, the area of the transmission area TA may be increased as the area of the pixel PX of the second display area DA2 is reduced compared to that of the pixel PX of the first display area DA1. Therefore, an amount of light incident on the optical devices 740, 750, 760, and 770 arranged on the back surface of the display panel 300 through the transmission areas TA may be increased. Accordingly, light sensing of the optical devices 740, 750, 760, and 770 may be improved.

Figure 9:
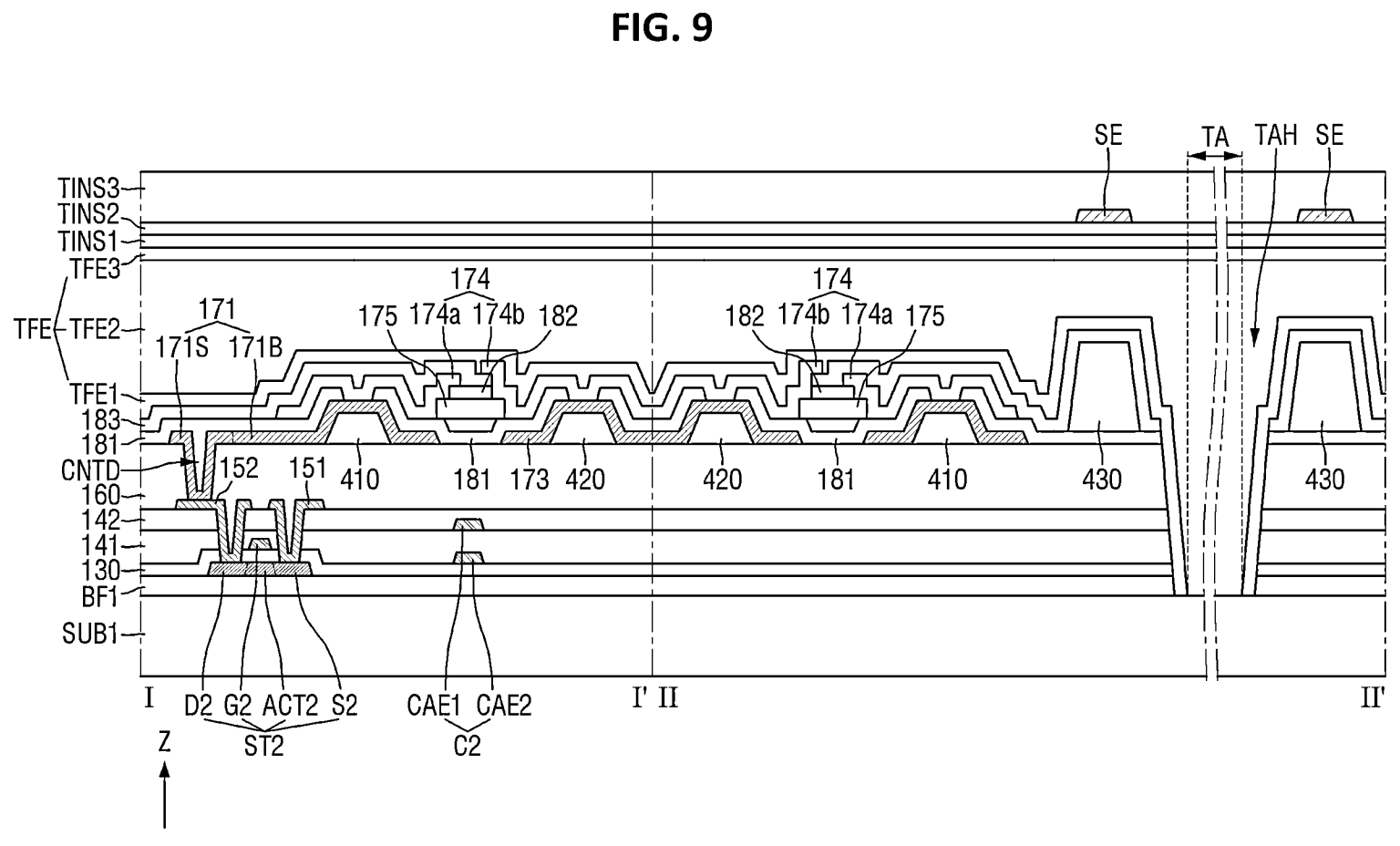

FIG. 9 is a cross-sectional view illustrating an example of a display panel taken along the lines I-I' and II-II' of FIG. 7. FIG. 9 illustrates a cross-sectional view of one of the sub-pixels SP1, SP2, and SP3 of the second display area DA2 and the transmission area TA.

Each of the sub-pixels SP1, SP2, and SP3 of the first display area DA1 may include at least one first thin film transistor, at least one first capacitor, and a plurality of light emitting elements. Referring to FIG. 9, each of the sub-pixels SP1, SP2, and SP3 of the second display area DA2 may include at least one second thin film transistor ST2, at least one second capacitor C2, and a plurality of light emitting elements 175. Since each of the sub-pixels SP1, SP2, and SP3 of the first display area DA1 may be substantially the same as that shown in FIG. 9 except that the transmission area TA is formed, a further description thereof will be omitted.

A first substrate SUB1 may be made of an insulating material, such as a polymer resin. For example, the first substrate SUB1 may include polyimide. Referring to FIG. 9, the first substrate SUB1 may be a flexible substrate capable of bending, folding, rolling, or the like.

A first buffer film BF1 may be disposed on the first substrate SUB1. The first buffer film BF1 is a film for protecting the second thin film transistor ST2 and the light emitting elements 175 from moisture penetrating through the first substrate SUB1 which may be vulnerable to moisture permeation. In an embodiment, the first buffer film BF1 may include a plurality of inorganic films alternately stacked. For example, the first buffer film BF1 may be formed as a multi-layer film in which one or more inorganic layers of a silicon nitride layer, a silicon oxynitride layer, a silicon oxide layer, a titanium oxide layer, and an aluminum oxide layer are alternately stacked.

A second active layer ACT2, a second source electrode S2, and a second drain electrode D2 of the second thin film transistor ST2 may be disposed on the first buffer film BF1. In an embodiment, the second active layer ACT2 may include polycrystalline silicon, monocrystalline silicon, low-temperature polycrystalline silicon, amorphous silicon, or an oxide semiconductor. The second source electrode S2 and the second drain electrode D2 may have conductivity by doping a silicon semiconductor or an oxide semiconductor with ions or impurities. The second active layer ACT2 may overlap a second gate electrode G2 in the third direction (Z-axis direction) which is a thickness direction of the first substrate SUB1, and the second source electrode S2 and the second drain electrode D2 may not overlap the second gate electrode G2 in the third direction (Z-axis direction).

A first gate insulating film 130 may be disposed on the second active layer ACT2, the second source electrode S2, and the second drain electrode D2. The first gate insulating film 130 may be formed of an inorganic layer, for example, a silicon nitride layer, a silicon oxynitride layer, a silicon oxide layer, a titanium oxide layer, or an aluminum oxide layer.

The second gate electrode G2 of the second thin film transistor ST2 and a second capacitor electrode CAE2 of the second capacitor C2 may be disposed on the first gate insulating film 130. The second gate electrode G2 may overlap the second active layer ACT2 in the third direction (Z-axis direction). A first capacitor electrode CAE1 may overlap the second capacitor electrode CAE2 in the third direction (Z-axis direction). The second gate electrode G2 and the second capacitor electrode CAE2 may be formed as a single layer or multiple layers including any of molybdenum (Mo), aluminum (Al), chromium (Cr), gold (Au), titanium (Ti), nickel (Ni), neodymium (Nd), and copper (Cu), or including an alloy thereof.

A first interlayer insulating film 141 may be disposed on the second gate electrode G2 and the second capacitor electrode CAE2. The first interlayer insulating film 141 may be formed of an inorganic layer, for example, a silicon nitride layer, a silicon oxynitride layer, a silicon oxide layer, a titanium oxide layer, or an aluminum oxide layer.

The first capacitor electrode CAE1 of the second capacitor C2 may be disposed on the first interlayer insulating film 141. Since the first interlayer insulating film 141 may have a predetermined dielectric constant, a capacitor may be formed by the first capacitor electrode CAE1, the second capacitor electrode CAE2, and the first interlayer insulating film 141. The first capacitor electrode CAE1 may be formed as a single layer or multiple layers including any of molybdenum (Mo), aluminum (Al), chromium (Cr), gold (Au), titanium (Ti), nickel (Ni), neodymium (Nd), and copper (Cu), or including an alloy thereof.

A second interlayer insulating film 142 may be disposed on the first capacitor electrode CAE1. The second interlayer insulating film 142 may be formed of an inorganic layer, for example, a silicon nitride layer, a silicon oxynitride layer, a silicon oxide layer, a titanium oxide layer, or an aluminum oxide layer. In an embodiment, the second interlayer insulating film 142 may include a plurality of inorganic layers.

A first connection electrode 151 and a second connection electrode 152 may be disposed on the second interlayer insulating film 142. The first connection electrode 151 may be connected to the second source electrode S2 through a contact hole penetrating the gate insulating film 130, the first interlayer insulating film 141, and the second interlayer insulating film 142 to expose the second source electrode S2 of the second thin film transistor ST2. The second connection electrode 152 may be connected to the second drain electrode D2 through a contact hole penetrating the gate insulating film 130, the first interlayer insulating film 141, and the second interlayer insulating film 142 to expose the second drain electrode D2 of the second thin film transistor ST2. Each of the first connection electrode 151 and the second connection electrode 152 may be formed as a single layer or multiple layers including any of molybdenum (Mo), aluminum (Al), chromium (Cr), gold (Au), titanium (Ti), nickel (Ni), neodymium (Nd), and copper (Cu), or including an alloy thereof.

A first planarization film 160 may be disposed on the first connection electrode 151 and the second connection electrode 152. The first planarization film 160 may be formed of an organic material, such as an acrylic resin, an epoxy resin, a phenolic resin, a polyamide resin, or a polyimide resin.

A first alignment electrode 171, a second alignment electrode 173, a first inner bank 410, a second inner bank 420, and an outer bank 430 may be disposed on the first planarization film 160.

The first inner bank 410, the second inner bank 420, and the outer bank 430 may be disposed to be spaced apart from each other. The height of the first inner bank 410 (for example, length in the third direction (Z-axis direction)) may be smaller than the height of the outer bank 430. The height of the second inner bank 420 may be smaller than the height of the outer bank 430. The first inner bank 410, the second inner bank 420, and the outer bank 430 may be formed of an organic material, such as an acrylic resin, an epoxy resin, a phenolic resin, a polyamide resin, or a polyimide resin.

Each of the first inner bank 410, the second inner bank 420, and the outer bank 430 may include a lower surface contacting the upper surface of the first planarization film 160, an upper surface facing away from the lower surface, and side surfaces between the upper surface and the lower surface. In an embodiment, the side surfaces of the first inner bank 410, the side surfaces of the second inner bank 420, and the side surfaces of the third inner bank 430 may be inclined. For example, each of the first inner bank 410, the second inner bank 420, and the outer bank 430 may have a trapezoidal cross-sectional shape, but the shape thereof is not limited thereto.

The first electrode branch portion 171B of the first alignment electrode 171 may be disposed on the first inner bank 410, and the second electrode branch portion 173B of the second alignment electrode 173 may be disposed on the second inner bank 420. The first electrode branch portion 171B of the first alignment electrode 171 may be connected to the first electrode stem portion 171S of the first alignment electrode 171. The first electrode stem portion 171S of the first alignment electrode 171 may be connected to the first connection electrode 152 in the first electrode contact hole CNTD. Therefore, the first alignment electrode 171 may be electrically connected to the second drain electrode D2 of the second thin film transistor ST2.

The first alignment electrode 171 and the second alignment electrode 173 may include a conductive material having high reflectance. For example, the first alignment electrode 171 and the second alignment electrode 173 may include a metal, such as silver (Ag), copper (Cu), or aluminum (Al). Accordingly, light traveling from the light emitting element 175 to the first alignment electrode 171 and the second alignment electrode 173, in the light emitted from the light emitting element 175, may be reflected by the first alignment electrode 171 and the second alignment electrode 173 and travel upward the light emitting element 175.

A first insulating film 181 may be disposed on the first alignment electrode 171 and the second alignment electrode 173. The first insulating film 181 may be disposed on the outer bank 430. The first electrode branch portion 171B disposed on the upper surface of the first inner bank 410 and the second electrode branch portion 173B disposed on the upper surface of the second inner bank 420 may be exposed without being covered by the first insulating film 181. The first insulating film 181 may be formed of an inorganic layer, for example, a silicon nitride layer, a silicon oxynitride layer, a silicon oxide layer, a titanium oxide layer, or an aluminum oxide layer.

The light emitting elements 175 may be disposed on the first insulating film 181 disposed between the first inner bank 410 and the second inner bank 420. One end of each of the light emitting elements 175 may be disposed adjacent to the first inner bank 410, and the other end thereof may be disposed adjacent to the second inner bank 420.

A second insulating film 182 may be disposed on the light emitting elements 175. The second insulating film 182 may be formed of an inorganic layer, for example, a silicon nitride layer, a silicon oxynitride layer, a silicon oxide layer, a titanium oxide layer, or an aluminum oxide layer.

The first contact electrode 174*a* may be in contact with the first electrode branch portion 171B exposed without being covered by the first insulating film 181, and may be in contact with one end of the light emitting element 175. The first contact electrode 174*a* may be disposed on the second insulating film 182. In order to prevent or substantially prevent the light emitted from the light emitting elements 175 from being blocked by the first contact electrode 174*a*, the first contact electrode 174*a* may be made of a transparent conductive oxide (TCO), such as indium tin oxide (ITO) or indium zinc oxide (IZO), which can transmit light.

A third insulating film 183 may be disposed on the first contact electrode 174*a*. The third insulating film 183 may be disposed to cover the first contact electrode 174*a* to electrically separate the first contact electrode 174*a* and the second contact electrode 174*b*. The third insulating film 183 may be formed of an inorganic layer, for example, a silicon nitride layer, a silicon oxynitride layer, a silicon oxide layer, a titanium oxide layer, or an aluminum oxide layer.

The second contact electrode 174*b* may be in contact with the second electrode branch portion 173B exposed without being covered by the first insulating film 181, and may be in contact with the other end of the light emitting element 175. The second contact electrode 174*b* may be disposed on the second insulating film 182 and the third insulating film 183. In order to prevent or substantially prevent the light emitted from the light emitting elements 175 from being blocked by the second contact electrode 174*b*, the second contact electrode 174*b* may be made of a transparent conductive oxide (TCO), such as indium tin oxide (ITO) or indium zinc oxide (IZO), which can transmit light.

One end of each of the light emitting elements 175 may be electrically connected to the second drain electrode D2 of the second thin film transistor ST2 through the first contact electrode 174*a* and the first alignment electrode 171, and the other end thereof may be connected to the second alignment electrode 173 through the second contact electrode 174*b*. Therefore, each of the light emitting elements 175 may emit light according to a current flowing from one end to the other end.

An encapsulation layer TFE may be disposed on the third insulating film 183 that is not covered by the second contact electrode 174*b*. In an embodiment, the encapsulation layer TFE may include a first inorganic film TFE1, an organic film TFE2, and a second inorganic film TFE3. The first inorganic film TFE1 may be disposed on the third insulating film 183 that is not covered by the second contact electrode 174*b*, the organic film TFE2 may be disposed on the first inorganic film TFE1, and the second inorganic film TFE3 may be disposed on the organic film TFE2. In an embodiment, each of the first inorganic film TFE1 and the second inorganic film TFE3 may be formed as a multi-layer film in which one or more inorganic layers of a silicon nitride layer, a silicon oxynitride layer, a silicon oxide layer, a titanium oxide layer, and an aluminum oxide layer are alternately stacked. In an embodiment, the organic film TFE2 may be formed of an acrylic resin, an epoxy resin, a phenolic resin, a polyamide resin, or a polyimide resin.

A first sensor insulating film TINS1 may be disposed on the encapsulation layer TFE. The first sensor insulating film TINS1 may include at least one inorganic layer. For example, the first sensor insulating film TINS1 may be formed as a multi-layer film in which one or more inorganic layers of a silicon nitride layer, a silicon oxynitride layer, a silicon oxide layer, a titanium oxide layer, and an aluminum oxide layer are alternately stacked.

A second sensor insulating film TINS2 may be disposed on the first sensor insulating film TINS1. The second sensor insulating film TINS2 may include at least one inorganic layer. For example, the second sensor insulating film TINS2 may be formed as a multi-layer film in which one or more inorganic layers of a silicon nitride layer, a silicon oxynitride layer, a silicon oxide layer, a titanium oxide layer, and an aluminum oxide layer are alternately stacked.

Sensor electrodes SE may be disposed on the second sensor insulating film TINS2. In an embodiment, the sensor electrodes SE may be self-capacitance type touch electrodes for sensing a user's touch. In another embodiment, the sensor electrodes SE may be mutual capacitance type touch electrodes including driving electrodes and sensing electrodes to sense a user's touch. In an embodiment, each of the sensor electrodes SE may be formed as a single layer of molybdenum (Mo), titanium (Ti), copper (Cu), or aluminum (Al), or may be formed as a laminate structure (Ti/Al/Ti) of aluminum and titanium, a laminate structure (ITO/Al/ITO) of aluminum and ITO, an APC alloy structure, or a laminate structure (ITO/APC/ITO) of an APC alloy and ITO.

In order to prevent or reduce the blocking of light emitted from the light emitting element 175 by the sensor electrodes SE, the sensor electrode SE may not overlap the light emitting element 175 in the third direction (Z-axis direction). The sensor electrode SE may overlap the outer bank 430 in the third direction (Z-axis direction).

A third sensor insulating film TINS3 may be disposed on the sensor electrodes SE. The third sensor insulating film TINS3 may include at least one of an inorganic layer and an organic layer. The inorganic layer may be a silicon nitride layer, a silicon oxynitride layer, a silicon oxide layer, a titanium oxide layer, or an aluminum oxide layer. The organic layer may include an acrylic resin, an epoxy resin, a phenolic resin, a polyamide resin, or a polyimide resin.

The transmission area TA may be an area in which the second thin film transistor ST2, the alignment electrodes 171 and 173, the contact electrodes 174, the light emitting element 175, and the sensor electrodes SE are not disposed to transmit light. The transmission area TA may include a transmission hole TAH. The transmission hole TAH may be a hole that penetrates the first buffer film BF1, the gate insulating film 130, the first interlayer insulating film 141, the second interlayer insulating film 142, the first planarization film 160, the first insulating film 181 and the third insulating film 182 to expose the first substrate SUB1. The transmission hole TAH may be filled with the encapsulating layer TFE. For example, the transmission hole TAH may be filled with the first inorganic film TFE1 and the organic film TFE2. Thus, in the transmission area TA, the first inorganic film TFE1 and the organic film TFE2 may be in contact with the first substrate SUB1. Further, since the transmission hole TAH of the transmission area TA is filled with the organic film TFE2, the maximum thickness of the organic film TFE2 in the transmission area TA may be greater than the maximum thickness of the organic film TFE2 in an area other than the transmission area TA.

Although it is illustrated in FIG. 9 that the transmission hole TAH is a hole that penetrates the first buffer film BF1, the gate insulating film 130, the first interlayer insulating film 141, the second interlayer insulating film 142, the first planarization film 160, the first insulating film 181 and the third insulating film 182 to expose the first substrate SUB1, the present invention is not limited thereto. The transmission hole TAH may be a hole that penetrates at least one of the first buffer film BF1, the gate insulating film 130, the first interlayer insulating film 141, the second interlayer insulating film 142, the first planarization film 160, the first insulating film 181 and the third insulating film 182.

When the first planarization film 160 is formed of polyimide having a high absorption rate of short-wavelength light, that is, blue-based light, in the light detected by the optical devices 740, 750, 760, and 770 through the transmission areas TA, the intensity of light having a short wavelength may be very low. Since the transmission area TA includes the transmission hole TAH penetrating the first planarization film 160 formed of polyimide, in the light incident on the optical devices 740, 750, 760, and 770 through the transmission area TA, light having a short wavelength may be prevented or substantially prevented from being absorbed by at least one organic layer.

Figure 10:
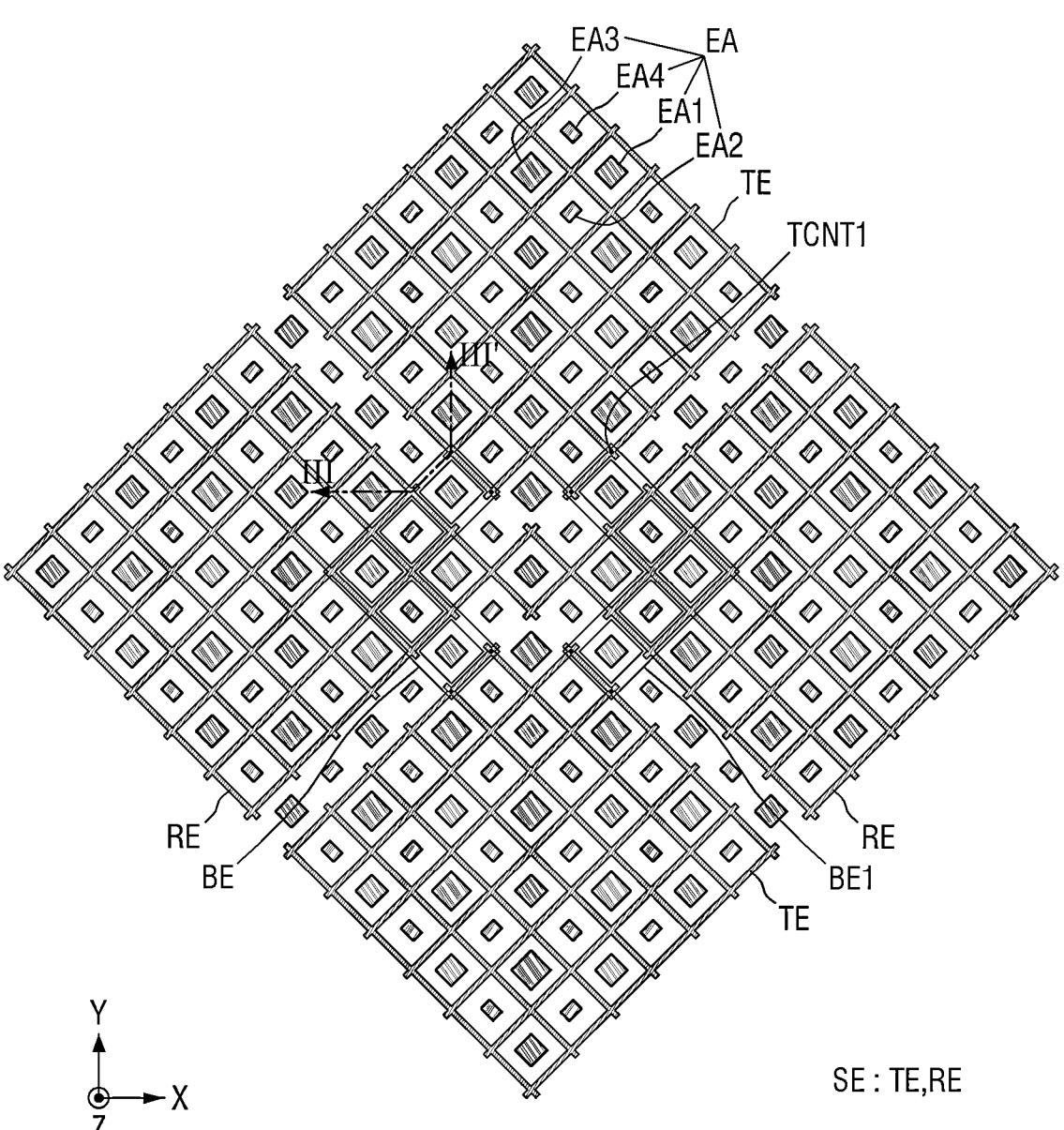
FIG. 10 is a layout view illustrating a first display area of a display panel according to another embodiment.

FIG. 10 is a layout view illustrating a first display area of a display panel according to another embodiment.

The embodiment of FIG. 10 is different from the embodiment of FIG. 5 in that the first display area DA1 includes an organic light emitting diode including a light emitting layer 272 as a light emitting element.

It is illustrated in FIG. 10 that the sensor electrodes SE are mutual capacitance type touch electrodes including driving electrodes TE and sensing electrodes RE to detect a user's touch. For convenience of explanation, FIG. 10 illustrates two sensing electrodes RE adjacent in the first direction (X-axis direction) and two driving electrodes TE adjacent in the second direction (Y-axis direction).

Referring to FIG. 10, the driving electrodes TE and the sensing electrodes RE may be electrically separated from each other. In an embodiment, the driving electrodes TE and the sensing electrodes RE are formed on the same layer, and they may be disposed to be spaced apart from each other. A gap may be formed between the driving electrode TE and the sensing electrode RE.

The sensing electrodes RE may be electrically connected to each other in the first direction (X-axis direction). The driving electrodes TE may be electrically connected to each other in the second direction (Y-axis direction). In order for the sensing electrodes RE and the driving electrodes TE to be electrically separated at their intersections, the driving electrodes TE adjacent to each other in the second direction (Y-axis direction) may be connected through first connection portions BE1.

The first connection portion BE1 may be formed on a different layer from the driving electrodes TE and the sensing electrodes RE, and may be connected to the driving electrodes TE through first sensor contact holes TCNT1. One end of the first connection portion BE1 may be connected to any one of the driving electrodes TE adjacent to each other in the second direction (Y-axis direction) through the first sensor contact holes TCNT1. The other end of the first connection portion BE1 may be connected to another of the driving electrodes TE adjacent to each other in the second direction (Y-axis direction) through the first sensor contact holes TCNT1. The first connection portion BE1 may overlap the sensing electrode RE in the third direction (Z-axis direction). Since the first connection portion BE1 is formed on a different layer from the driving electrodes TE and the sensing electrodes RE, the first connection portion BE1 may be electrically separated from the sensing electrode RE despite overlapping the sensing electrode RE in the third direction (Z-axis direction).

In an embodiment, the first connection portions BE1 may be formed to be bent at least once. Although it is illustrated in FIG. 10 that the first connecting portions BE1 are bent like a clasp ("<" or ">"), the shape of the first connection portions BE1 is not limited thereto. Further, since the driving electrodes TE adjacent to each other in the second direction (Y-axis direction) are connected by the plurality of first connection portions BE1, even if one of the first connection units BE1 is disconnected, the driving electrodes TE adjacent to each other in the second direction (Y-axis direction) may be electrically connected to each other.

Each of the driving electrodes TE and the sensing electrodes RE may have a planar shape of a mesh structure or a network structure. Since the driving electrodes TE and the sensing electrodes RE are formed on the encapsulation layer (TFE of FIG. 11), a distance between the first contact electrode 174a or the second contact electrode 174b and the driving electrode TE or the sensing electrode RE is short. Therefore, parasitic capacitance may be formed between the first contact electrode 174a or the second contact electrode 174b and the driving electrode TE or the sensing electrode RE. Since the parasitic capacitance is proportional to the overlap area between the first contact electrode 174a or the second contact electrode 174b and the driving electrode TE or the sensing electrode RE, in order to reduce parasitic capacitance, in an embodiment, each of the driving electrodes TE and the sensing electrodes RE has a planar shape of a mesh structure or a network structure.

The first display area DA1 may include light emitting areas EA. Each of the light emitting areas EA includes a first light emitting area EA1 emitting a first light, a second light emitting area EA2 emitting a second light, a third light emitting area EA3 emitting a third light, and a fourth light emitting area EA4 emitting a fourth light. In an embodiment, the first light emitting area EA1, the second light emitting area EA2, the third light emitting area EA3, and the fourth light emitting area EA4 may emit light of different colors from each other. In another embodiment, two of the first light emitting area EA1, the second light emitting area EA2, the third light emitting area EA3, and the fourth light emitting area EA4 may emit light of a same color. For example, the first light emitting area EA1 may emit red light, the second light emitting area EA2 and the fourth light emitting area EA4 may emit green light, and the third light emitting area EA3 may emit blue light.

It is illustrated in FIG. 10 that each of the first light emitting area EA1, the second light emitting area EA2, the third light emitting area EA3, and the fourth light emitting area EA4 has a rectangular planar shape such as a rhombus, but the present invention is not limited thereto. For example, the first light emitting area EA1, the second light emitting area EA2, the third light emitting area EA3, and the fourth light emitting area EA4 may have a polygonal, circular, or elliptical plane shape other than a rectangular shape. Further, it is illustrated in FIG. 10 that among the first light emitting area EA1, the second light emitting area EA2, the third light emitting area EA3, and the fourth light emitting area EA4, the third light emitting area EA3 has the largest size, the first light emitting area EA1 has the second largest size, and the second light emitting area EA2 and the fourth light emitting area EA4 have the smallest size, but the present invention is not limited thereto.

In an embodiment, since the driving electrodes TE, the sensing electrodes RE, and the first connection portions BE1 are formed in a mesh structure or a network structure on a plane, the light emitting areas EA may not overlap the driving electrodes TE, the sensing electrodes RE, and the first connection portions BE1 in the third direction (Z-axis direction). Therefore, the light emitted from the light emitting areas EA is blocked by the driving electrodes TE, the sensing electrodes RE, and the first connection portions BE1, thereby preventing or decreasing the reduction in luminance of light.

Figure 11:
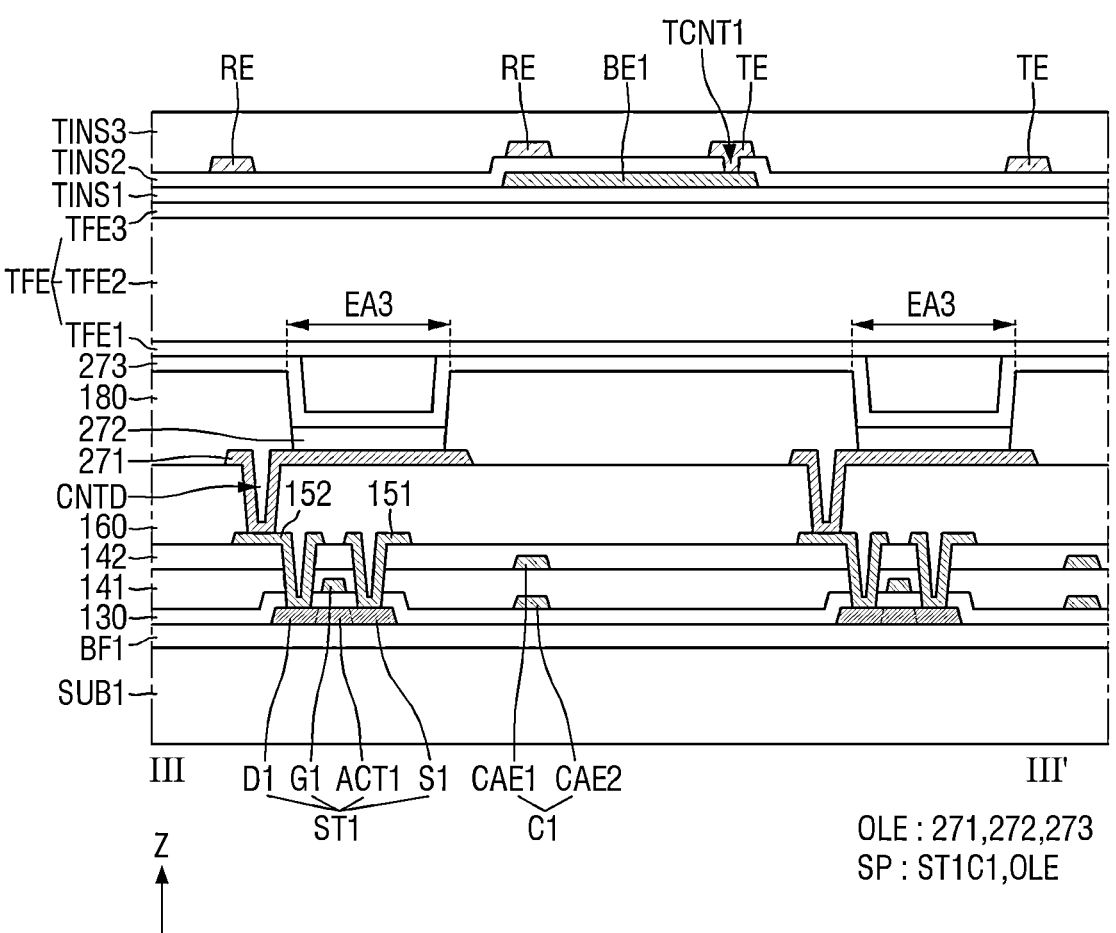
FIG. 11 is a cross-sectional view illustrating an example of a display panel taken along the line III-III' of FIG. 10.

FIG. 11 is a cross-sectional view illustrating an example of a display panel taken along the line III-III' of FIG. 10.

FIG. 11 illustrates a cross-sectional view of a sub-pixel SP corresponding to the third light emitting area EA3 of the first display area DA1.

Referring to FIG. 11, the sub-pixel SP of the first display area DA1 may include at least one first thin film transistor ST1, at least one first capacitor C1, and an organic light emitting diode OLE.

Since the first thin film transistor ST1 and the first capacitor C1 may be substantially the same as those of the second thin film transistor ST2 and the second capacitor C2 described with reference to FIG. 9, further descriptions thereof will be omitted. Further, since the first substrate SUB1, the first buffer film BF1, the gate insulating film 130, the first interlayer insulating film 141, the second interlayer insulating film 142, and the first planarization film 160 may also be substantially the same as those described with reference to FIG. 9, further descriptions thereof will be omitted.

The organic light emitting diode OLE and a bank 180 may be disposed on the first planarization film 160. The organic light emitting diode OLE includes a first light emitting electrode 271, a light emitting layer 272, and a second light emitting electrode 273.

The first light emitting electrode 271 may be formed on the first planarization film 160. The first light emitting electrode 271 may be connected to the second connection electrode 152 through a contact hole CNTD that penetrates the first planarization film 160 to expose the second connection electrode 152.

In a top emission structure in which light is emitted in the direction of the second light emitting electrode 273 based on the light emitting layer 272, the first light emitting electrode 271 may be formed of a metal material having high reflectance, such as a laminate structure (Ti/Al/Ti) of aluminum and titanium, a laminate structure (ITO/Al/ITO) of aluminum and ITO, an APC alloy, or a laminate structure (ITO/APC/ITO) of an APC alloy and ITO. The APC alloy is an alloy of silver (Ag), palladium (Pd), and copper (Cu).

The bank 180 may be disposed on the first planarization film 160. The bank 180 may be formed to partition the first light emitting electrode 271 to define the light emitting area EA. The bank 180 may be formed to cover the edge of the first light emitting electrode 271. The bank 180 may be formed of an organic material, such as an acrylic resin, an epoxy resin, a phenolic resin, a polyamide resin, or a polyimide resin.

The first light emitting area EA1, the second light emitting area EA2, the third light emitting area EA3, and the fourth light emitting area EA4 are referred to as areas in which the first light emitting electrode 271, the light emitting layer 272, and the second light emitting electrode 273 are sequentially stacked, and, thus, holes from the first light emitting electrode 271 and electrons from the second light emitting electrode 273 are recombined with each other in the light emitting layer 272 to emit light.

The light emitting layer 272 is formed on the first light emitting electrode 271 and the bank 180. The light emitting layer 272 may include an organic material to emit light of a color (e.g., a predetermined color). For example, the light emitting layer 272 may include a hole transporting layer, an organic material layer, and an electron transporting layer.

The second light emitting electrode 273 may be formed on the light emitting layer 272. The second light emitting electrode 273 may be formed to cover the light emitting layer 272. In an embodiment, the second light emitting electrode 273 may be a common layer formed in common in all light emitting areas EA. A capping layer may be formed on the second light emitting electrode 273.

In the top emission structure, the second light emitting electrode 273 may be formed of a transparent conductive oxide (TCO), such as indium tin oxide (ITO) or indium zinc oxide (IZO), that can transmit light, or may be formed of a semi-transmissive conductive material, such as magnesium (Mg), silver (Ag), or an alloy of magnesium (Mg) and silver (Ag). In an embodiment, when the second light emitting electrode 273 is formed of a semi-transmissive metal material, light emission efficiency may be increased by microcavities.

An encapsulation layer TFE may be disposed on the second light emitting electrode 273, and a first connection portion BE1, driving electrodes TE, and sensing electrodes RE may be disposed on the encapsulation layer TFE.

Since the encapsulation layer TFE may be substantially the same as that described with reference to FIG. 9, a further description thereof will be omitted.

The first connection portion BE1 may be disposed on the first sensor insulating film TINS1, and may be covered by the second sensor insulating film TINS2. The first connection portion BE1 may not overlap the first light emitting area EA1, the second light emitting area EA2, the third light emitting area EA3, and the fourth light emitting area EA4 in the third direction (Z-axis direction). The first connection portion BE1 may overlap the bank 180 in the third direction (Z-axis direction). In an embodiment, the first connection portion BE1 may be formed as a single layer of molybdenum (Mo), titanium (Ti), copper (Cu), or aluminum (Al), or may be formed of a laminate structure (Ti/Al/Ti) of aluminum and titanium, a laminate structure (ITO/Al/ITO) of aluminum and ITO, an APC alloy, or a laminate structure (ITO/APC/ITO) of an APC alloy and ITO.

The sensing electrode RE and the driving electrode TE may be disposed on the second sensor insulating film TINS2, and may be covered by the third sensor insulating film TINS3. The sensing electrode RE and the driving electrode TE may not overlap the first light emitting area EA1, the second light emitting area EA2, the third light emitting area EA3, and the fourth light emitting area EA4 in the third direction (Z-axis direction). The sensing electrode RE and the driving electrode TE may overlap the bank 180 in the third direction (Z-axis direction). The driving electrode TE may be connected to the first connection portion BE1 through the first sensor contact hole TCNT1 penetrating the second sensor insulating film TINS2. In an embodiment, the sensing electrode RE and the driving electrode TE may be formed as a single layer of molybdenum (Mo), titanium (Ti), copper (Cu), or aluminum (Al), or may be formed of a laminate structure (Ti/Al/Ti) of aluminum and titanium, a laminate structure (ITO/Al/ITO) of aluminum and ITO, an APC alloy, or a laminate structure (ITO/APC/ITO) of an APC alloy and ITO.

Figure 12:
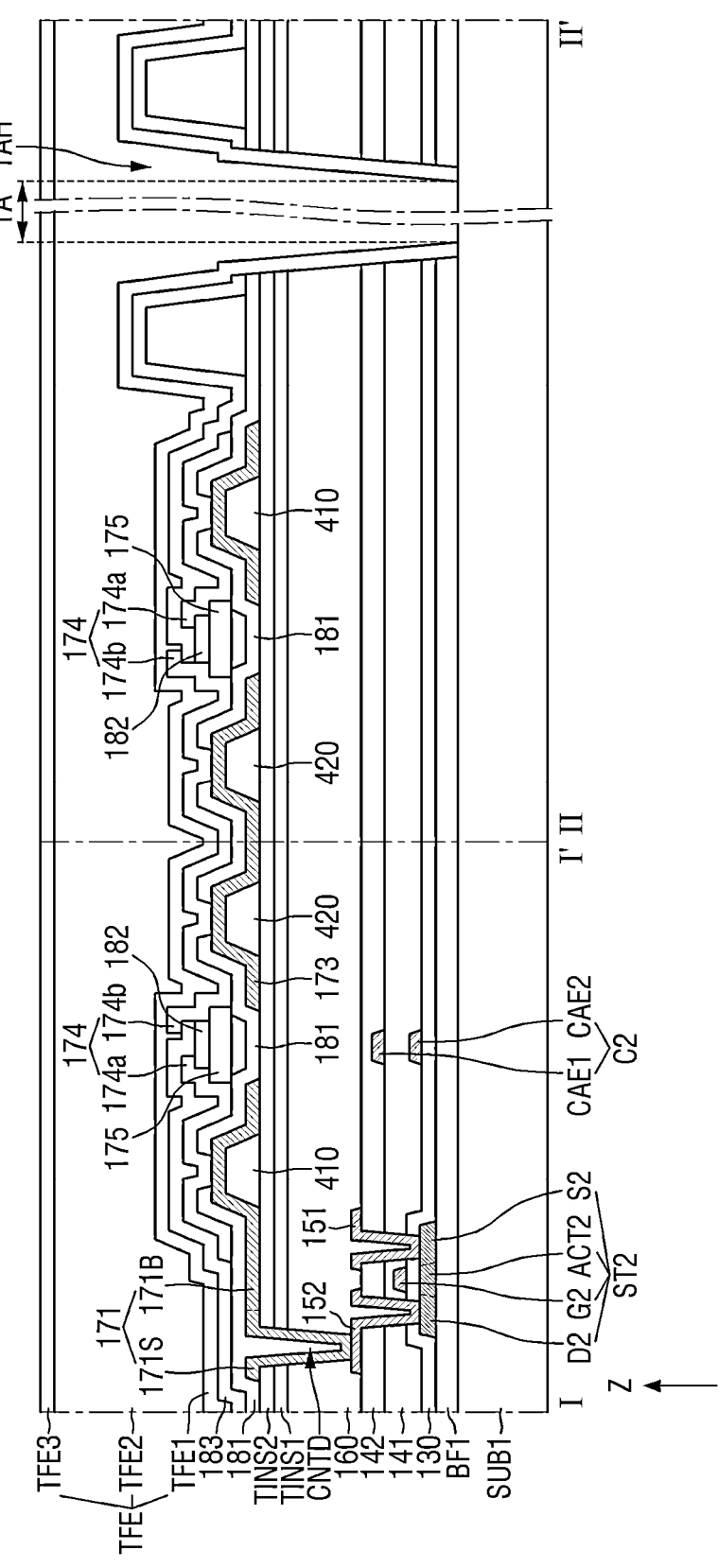
FIG. 12 is a cross-sectional view illustrating another example of a display panel taken along the lines I-I' and II-II' of FIG. 7.

FIG. 12 is a cross-sectional view illustrating another example of a display panel taken along the lines I-I' and II-II' of FIG. 7.

The embodiment of FIG. 12 is different from the embodiment of FIG. 9 in that, in the second display area DA2, the first sensor insulating film TINS1 and the second sensor insulating film TINS2 are disposed on the first planarization film 160, and the first alignment electrode 171, the second alignment electrode 173, the first inner bank 410, the second inner bank 420, and the outer bank 430 are disposed on the second sensor insulating film TINS2. In FIG. 12, differences from the embodiment of FIG. 9 will be mainly described.

Referring to FIG. 12, the first alignment electrode 171 and the second alignment electrode 173 are disposed on the second sensor insulating film TINS2. That is, the first alignment electrode 171 and the second alignment electrode 173 may be disposed on a same layer as the sensing electrodes RE and the driving electrodes TE. In an embodiment, the first alignment electrode 171 and the second alignment electrode 173 may be made of a same material as the sensing electrodes RE and the driving electrodes TE.

The first electrode stem portion 171S of the first alignment electrode 171 may be connected to the second connection electrode 152 through the first electrode contact hole CNTD penetrating the planarization film 160, the first sensor insulating film TINS1, and the second sensor insulating film TINS2. Further, the transmission hole TAH may penetrate the first sensor insulating film TINS1 and the second sensor insulating film TINS2.

As shown in FIG. 12, when the first alignment electrode 171 and the second alignment electrode 173 are disposed on the same layer as the sensing electrodes RE and the driving electrodes TE, and the sensing electrodes RE and the driving electrodes TE are made of the same material, the first alignment electrode 171, the second alignment electrode 173, the sensing electrodes RE, and the driving electrodes TE may be formed by one mask process. Therefore, any one of the mask process for forming the first alignment electrode 171 and the second alignment electrode 173 and the mask process for forming the sensing electrodes RE and the driving electrodes TE may be omitted, such that manufacturing costs may be reduced.

Figure 13:
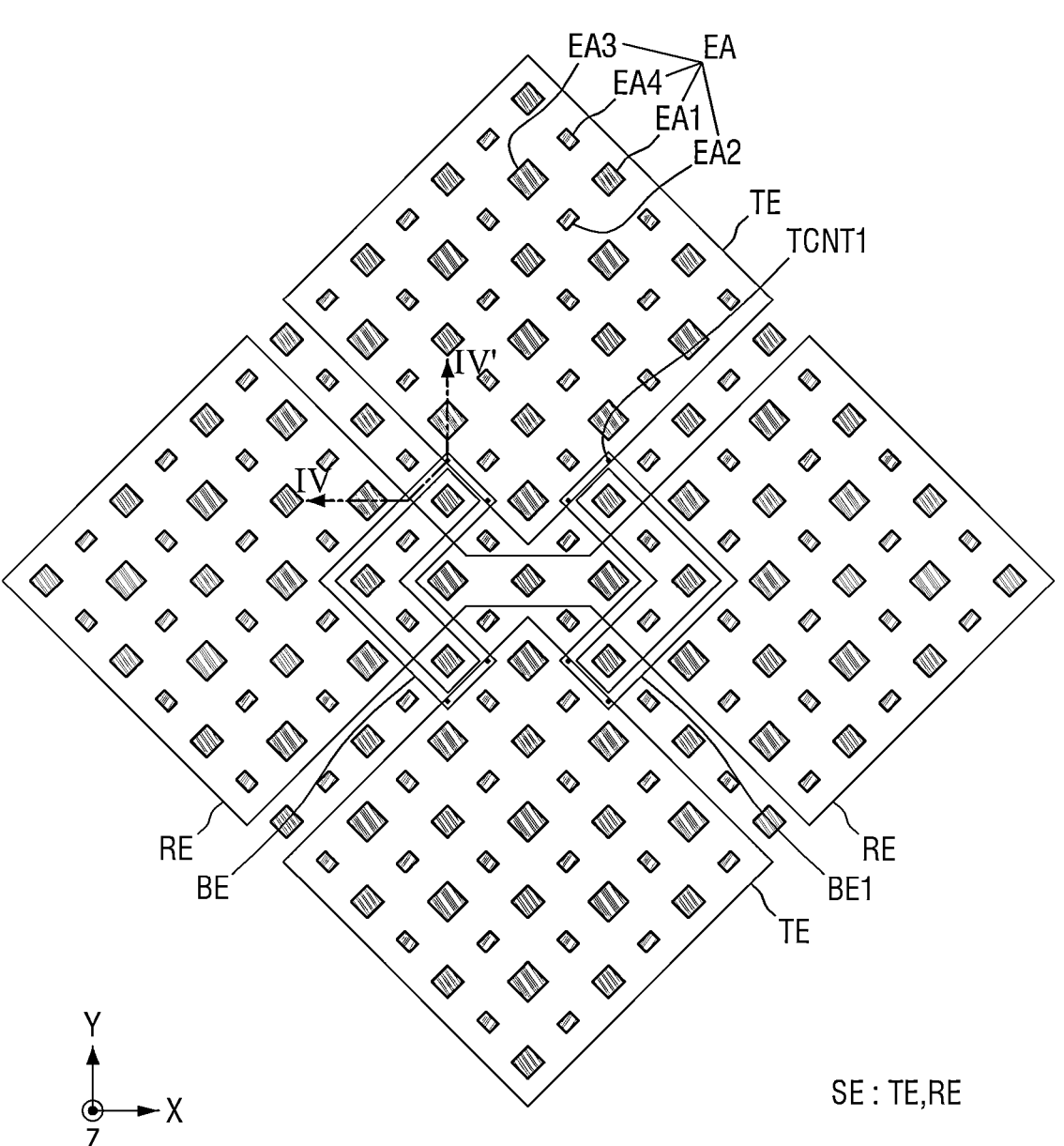
FIG. 13 is a layout view illustrating a first display area of a display panel according to another embodiment.

FIG. 13 is a layout view illustrating a first display area of a display panel according to another embodiment.

The embodiment of FIG. 13 is different from the embodiment of FIG. 10 in that each of the sensing electrodes RE and the driving electrodes TE has a rectangular planar structure rather than a mesh structure or a network structure. In FIG. 13, differences from the embodiment of FIG. 10 will be mainly described.

Referring to FIG. 13, since the sensing electrodes RE and the driving electrodes TE have a rectangular planar structure, they may overlap the light emitting areas EA in the third direction (Z-axis direction). In an embodiment, the sensing electrodes RE and the driving electrodes TE may be formed of a transparent conductive oxide (TCO), such as indium tin oxide (ITO) or indium zinc oxide (IZO), which can transmit light. Thus, even if the sensing electrodes RE and the driving electrodes TE overlap the light emitting areas EA in the third direction (Z-axis direction), the light emitted from the light emitting areas EA may not be blocked by the sensing electrodes RE and the driving electrodes TE.

Figure 14:
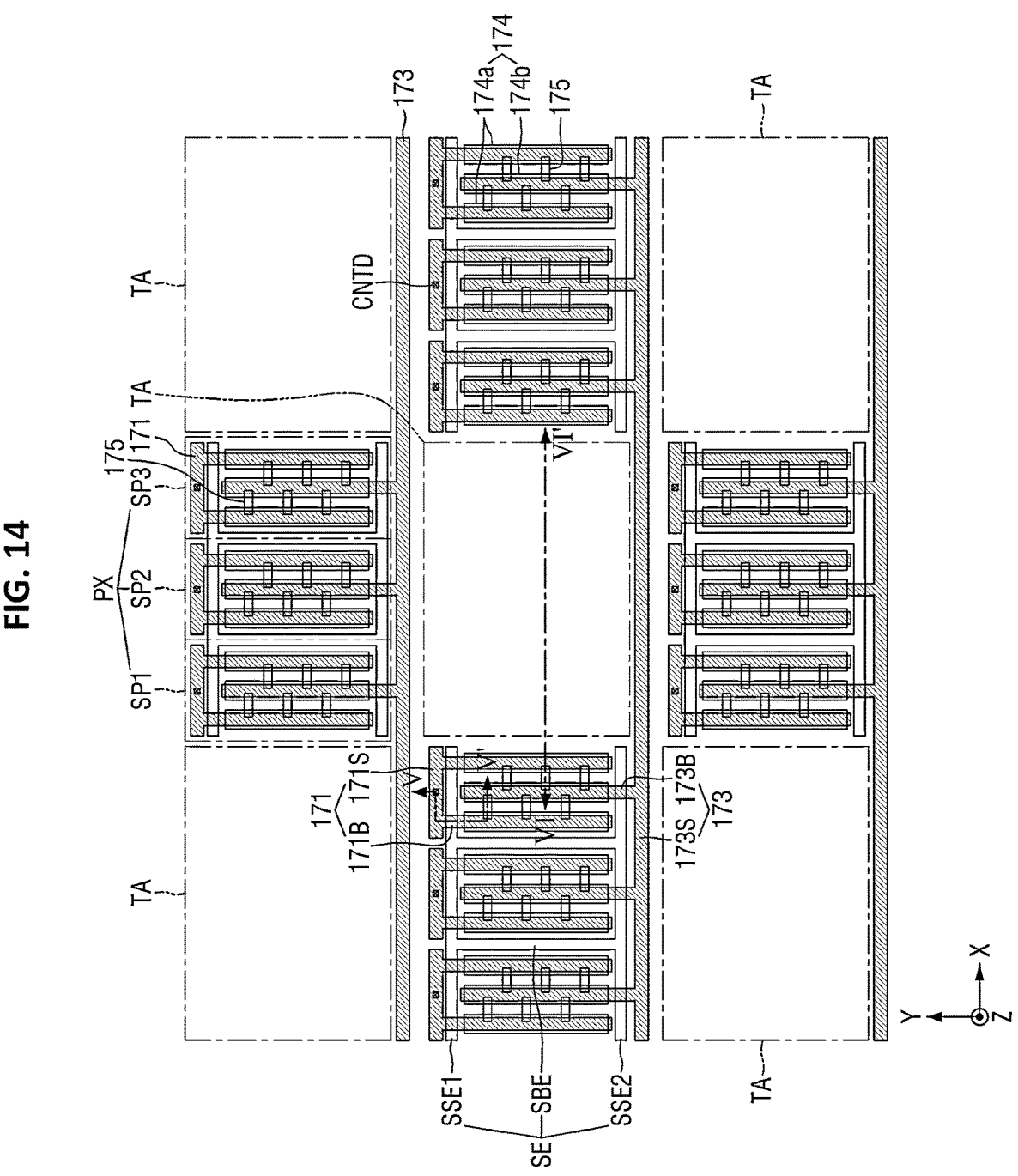
FIG. 14 is a layout view illustrating a second display area of a display panel according to another embodiment.

FIG. 14 is a layout view illustrating a second display area of a display panel according to another embodiment.

The embodiment of FIG. 14 is different from the embodiment of FIG. 7 in that the sensor electrode SE crosses the first alignment electrodes 171 and the second alignment electrodes 173 in the second display area DA2. In FIG. 14, differences from the embodiment of FIG. 7 will be mainly described.

Referring to FIG. 14, the sensor electrode SE may be disposed apart from the first contact electrodes 174a and the second contact electrodes 174b. The sensor electrode SE may include a first sub-sensor electrode SSE1, a second sub-sensor electrode SSE2, and sensor connection electrodes SBE.

The first sub-sensor electrode SSE1 may extend in the first direction (X-axis direction). The first sub-sensor electrode SSE1 may be disposed to cross the sub-pixels SP1, SP2, and SP3 of the pixel PX. The first sub-sensor electrode SSE1 may intersect the first electrode branch portions 171B of the first alignment electrodes 171 of the sub-pixels SP1, SP2, and SP3 of the pixel PX.

The second sub-sensor electrode SSE2 may extend in the first direction (X-axis direction). The second sub-sensor electrode SSE2 may be disposed to cross the sub-pixels SP1, SP2, and SP3 of the pixel PX. The second sub-sensor electrode SSE2 may intersect the second electrode branch portions 173B of the second alignment electrodes 173 of the sub-pixels SP1, SP2, and SP3 of the pixel PX.

Sensor connection electrodes SBE may extend in the second direction (Y-axis direction). Each of the sensor connection electrodes SBE may be disposed between the first sub-sensor electrode SSE1 and the second sub-sensor electrode SSE2 to connect the first sub-sensor electrode SSE1 and the second sub-sensor electrode SSE2. One end of each of the sensor connection electrodes SBE may be connected to the first sub-sensor electrode SSE1, and the other end thereof may be connected to the second sub-sensor electrode SSE2.

The sensor connection electrodes SBE may be disposed at boundaries among sub-pixels SP1, SP2, and SP3 of the pixel PX. The sensor connection electrodes SBE may be disposed at a boundary between the first sub-pixel SP1 and the second sub-pixel SP2, and a boundary between the second sub-pixel SP2 and the third sub-pixel SP3. Although FIG. 14 illustrates two sensor connection electrodes SBE, the number of sensor connection electrodes SBE is not limited thereto. The number of sensor connection electrodes SBE may be one or more.

FIG. 15 is a cross-sectional view illustrating another example of a display panel taken along the line IV-IV' of FIG. 13.

The embodiment of FIG. 15 is different from the embodiment of FIG. 11 in that a display panel 300 further includes a filling layer FL, a second substrate SUB2, a second buffer film BF2, a second gate insulating film 230, a third interlayer insulating film 241, a fourth interlayer insulating film 242, and a second planarization film 260, and the first connection portion BE1, the sensing electrodes RE, and the driving electrodes TE are disposed on the second planarization film 260. In FIG. 15, differences from the embodiment of FIG. 11 will be mainly described.

Referring to FIG. 15, the sub-pixels SP of the first display area DA1 may be disposed on the first substrate SUB1, and the sub-pixels SP1, SP2, and SP3 of the second display area DA2 and the sensor electrodes SE may be disposed on the second substrate SUB2.

The second substrate SUB2 may be disposed over the second light emitting electrode 273. The second substrate SUB2 may be made of an insulating material, such as a polymer resin. For example, the second substrate SUB2 may include polyimide. In an embodiment, the second substrate SUB2 may be a flexible substrate capable of bending, folding, rolling, or the like.

The filling layer FL may be disposed between the second light emitting electrode 273 and the second substrate SUB2. In an embodiment, the filling layer FL may be an epoxy filling film or a silicon filling film. In another embodiment, the filling layer FL may be empty in a vacuum.

The second buffer film BF2 may be disposed on the second substrate SUB2. The second buffer film BF2 is a film for protecting the second thin film transistor ST2 and the light emitting elements 175 from moisture penetrating through the second substrate SUB2 which is vulnerable to moisture permeation. In an embodiment, the second buffer film BF2 may include a plurality of inorganic films alternately stacked. For example, the second buffer film BF2 may be formed as a multi-layer film in which one or more inorganic layers of a silicon nitride layer, a silicon oxynitride layer, a silicon oxide layer, a titanium oxide layer, and an aluminum oxide layer are alternately stacked.

The second thin film transistors ST2 of the second display area DA2 may be disposed on the second buffer film BF2. Since the second thin film transistors ST2 are not disposed in the first display area DA1, the second gate insulating film 230, the third interlayer insulating film 241, the fourth interlayer insulating film 242, and the second planarization film 260 may be sequentially stacked on the second buffer film BF2. Since the second gate insulating film 230, the third interlayer insulating film 241, the fourth interlayer insulating film 242, and the second planarization film 260 may be substantially the same as the first gate insulating film 130, the first interlayer insulating film 141, the second interlayer insulating film 142, and the first planarization film 160 shown in FIGS. 9, 11, and 12, further descriptions thereof will be omitted.

A first sensor insulating film TINS1 may be disposed on the second planarization film 260. Since the first sensor insulating film TINS1 may be substantially the same as that described with reference to FIG. 9, a further description thereof will be omitted.

A first connection portion BE1 may be disposed on the first sensor insulating film TINS1. Since the first connection portion BE1 may be substantially the same as that described with reference to FIG. 11, a further description thereof will be omitted.

The sensing electrode RE and the driving electrode TE may be disposed on the second sensor insulating film TINS2, and may be covered by the third sensor insulating film TINS3. The sensing electrode RE and the driving electrode TE may overlap the first light emitting area EA1, the second light emitting area EA2, the third light emitting area EA3, and the fourth light emitting area EA4 in the third direction (Z-axis direction). The sensing electrode RE and the driving electrode TE may overlap the bank 180 in the third direction (Z-axis direction). The driving electrode TE may be connected to the first connection portion BE1 through the first sensor contact hole TCNT1 penetrating the second sensor insulating film TINS2. In an embodiment, the sensing electrode RE and the driving electrode TE may be formed of a transparent conductive oxide (TCO), such as indium tin oxide (ITO) and indium zinc oxide (IZO), that can transmit light. Thus, even when the sensing electrodes RE and the driving electrodes TE overlap the light emitting areas EA in the third direction (Z-axis direction), the light emitted from the light emitting areas EA may not be blocked by the sensing electrodes RE and the driving electrodes TE.

Figure 16:
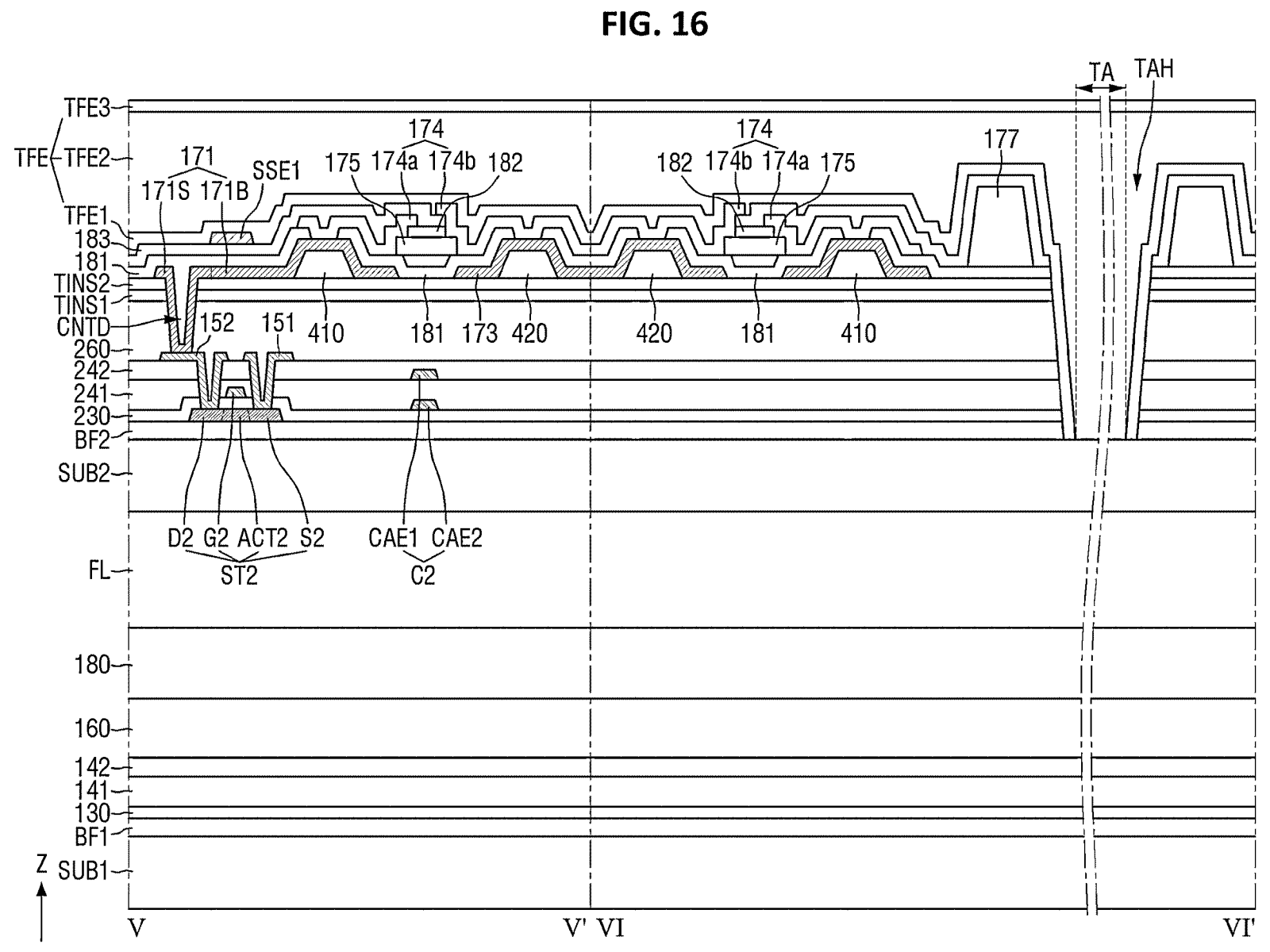

FIG. 16 is a cross-sectional view illustrating an example of a display panel taken along the lines V-V' and VI-VI' of FIG. 14.

The embodiment of FIG. 16 is different from the embodiment of FIG. 12 in that a filling layer FL, a second substrate SUB2, a second buffer film BF2, a second gate insulating film 230, a third interlayer insulating film 241, a fourth interlayer insulating film 242, and a second planarization film 260 are further provided, and the first sub-sensor electrode SSE1 of the sensor electrode SE is disposed on the third insulating film 183. In FIG. 16, differences from the embodiment of FIG. 12 will be mainly described.

Referring to FIG. 16, the sub-pixels SP of the first display area DA1 may be disposed on the first substrate SUB1, and the sub-pixels SP1, SP2, and SP3 of the second display area DA2 and the sensor electrodes SE may be disposed on the second substrate SUB2.

Since the filling layer FL, the second substrate SUB2, the second buffer film BF2, the second gate insulating film 230, the third interlayer insulating film 241, the fourth interlayer insulating film 242, and the second planarization film 260 may be substantially the same as those described with reference to FIG. 15, further descriptions thereof will be omitted.

A second active layer ACT2, a second source electrode S2, and a second drain electrode D2 of the second thin film transistor ST2 may be disposed on the second buffer film BF2. The second gate insulating film 230 may be disposed on the second active layer ACT2, the second source electrode S2, and the second drain electrode D2.

A second gate electrode G2 of the second thin film transistor TFT2 and a second capacitor electrode CAE2 of the second capacitor C2 may be disposed on the second gate insulating film 230. The third interlayer insulating film 241 may be disposed on the second gate electrode G2 and the second capacitor electrode CAE2.

A first capacitor electrode CAE1 of the second capacitor C2 may be disposed on the third interlayer insulating film 241. The fourth interlayer insulating film 242 may be disposed on the first capacitor electrode CAE1.

A third connection electrode 251 and a fourth connection electrode 252 may be disposed on the third interlayer insulating film 242. The third connection electrode 251 may be connected to the second source electrode S2 through a contact hole penetrating the second gate insulating film 230, the third interlayer insulating film 241, and the fourth interlayer insulating film 242 to expose the second source electrode S2 of the second thin film transistor ST2. The fourth connection electrode 252 may be connected to the second drain electrode D2 through a contact hole penetrating the second gate insulating film 230, the third interlayer insulating film 241, and the fourth interlayer insulating film 242 to expose the second drain electrode D2 of the second thin film transistor ST2. The second planarization film 260 may be disposed on the third connection electrode 251 and the fourth connection electrode 252. In an embodiment, each of the third connection electrode 251 and the fourth connection electrode 252 may be formed of a single layer or multiple layer including any of molybdenum (Mo), aluminum (Al), chromium (Cr), gold (Au), titanium (Ti), nickel (Ni), neodymium (Nd), and copper (Cu) or including an alloy thereof.

The first sub-sensor electrode SSE1 of the sensor electrode SE may be disposed on the third insulating film 183, and may be covered by the first inorganic film TFE1. That is, the first sub-sensor electrode SSE1 of the sensor electrode SE may be disposed on a same layer as the second contact electrode 174*b*. The first sub-sensor electrode SSE1 of the sensor electrode SE may be made of a same material as the second contact electrode 174*b*.

Further, the second sub-sensor electrode SSE2 of the sensor electrode SE and the sensor connection electrodes SBE may be disposed on the third insulating film 183, and may be covered by the first inorganic film TFE1. That is, the second sub-sensor electrode SSE2 of the sensor electrode SE and the sensor connection electrodes SBE may be disposed on a same layer as the second contact electrode 174*b*. The second sub-sensor electrode SSE2 of the sensor electrode SE and the sensor connection electrodes SBE may be made of a same material as the second contact electrode 174*b*.

As shown in FIG. 16, when the sensor electrode SE is disposed on the same layer as the second contact electrode 174*b* and is made of the same material as the second contact electrode 174*b*, the sensor electrode SE and the second contact electrode 174*b* may be formed by one mask process. Therefore, any one of the mask process for forming the sensor electrode SE and the mask process for forming the second contact electrode 174*b* may be omitted, thereby reducing a manufacturing cost.

Figure 17:
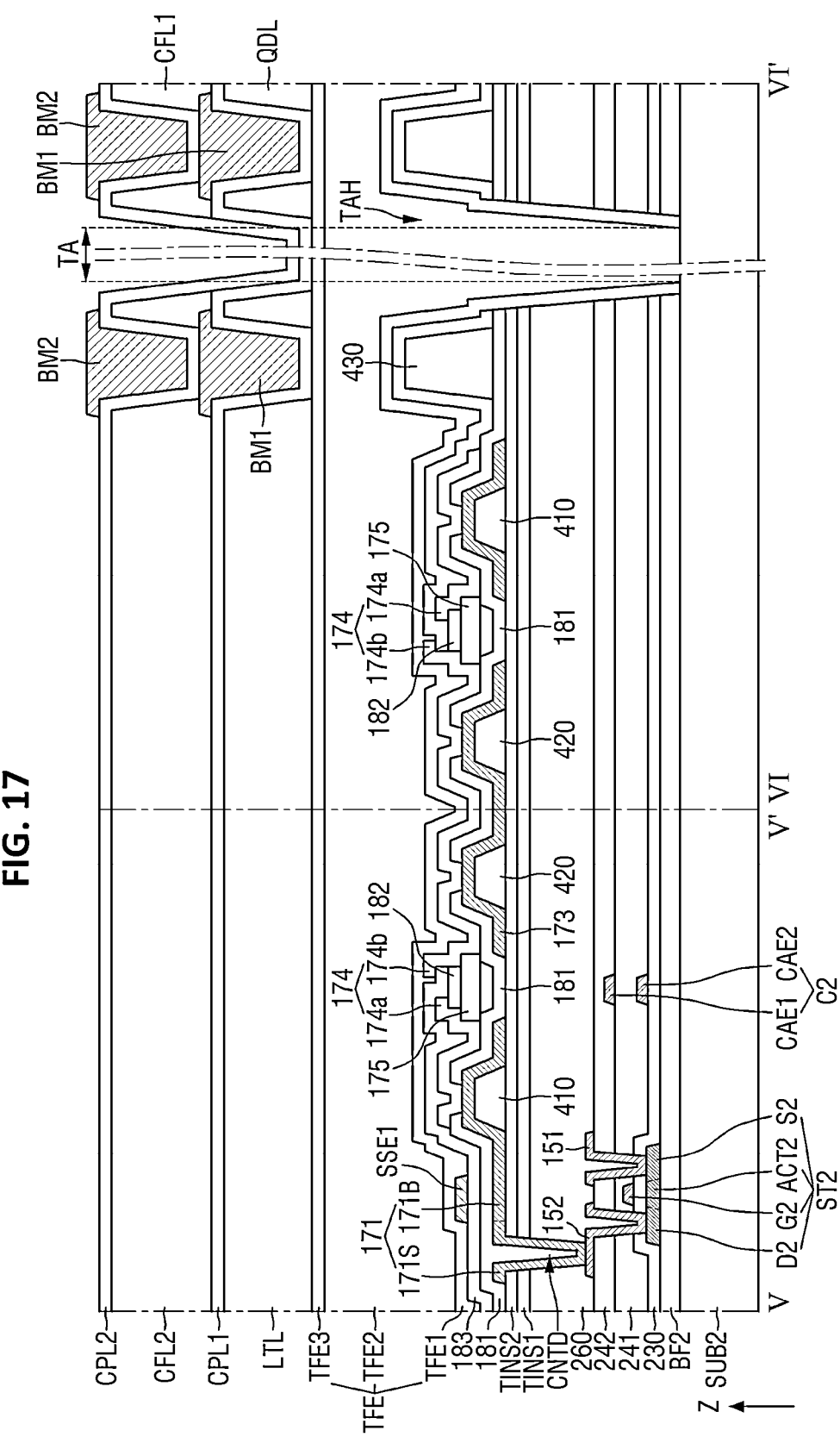
FIG. 17 is a cross-sectional view illustrating another example of a display panel taken along the lines V-V' and VI-VI' of FIG. 14.

FIG. 17 is a cross-sectional view illustrating another example of a display panel taken along the lines V-V' and VI-VI' of FIG. 14.

With respect to FIG. 17, descriptions of the first substrate SUB1, the first buffer film BF1, the first gate insulating film 130, the first interlayer insulating film 141, the second interlayer insulating film 142, the first planarization film 160, the bank 180, and the filling layer FL are omitted to avoid redundant descriptions thereof.

The embodiment of FIG. 17 is different from the embodiment of FIG. 16 in that a light transmitting layer LTL, a wavelength conversion layer QDL, a first color filter layer CFL1, a second color filter layer CFL2, a first light blocking layer BM1, and a second light blocking layer BM2 are disposed on the encapsulation layer TFE. In FIG. 17, differences from the embodiment of FIG. 16 will be mainly described.

Referring to FIG. 17, the wavelength conversion layer QDL, the light transmitting layer LTL, and the first light blocking layer BM1 may be disposed on the encapsulation layer TFE.

The wavelength conversion layer QDL may overlap the first sub-pixel SP1 and the second sub-pixel SP2. The wavelength conversion layer QDL may convert light emitted from the light emitting elements 175 of the first sub-pixel SP1 or the second sub-pixel SP2 into light of a different color. For example, the wavelength conversion layer QDL overlapping the first sub-pixel SP1 may convert third light emitted from the light emitting elements 175 of the first sub-pixel SP1 into first light. The wavelength conversion layer QDL overlapping the second sub-pixel SP2 may convert third light emitted from the light emitting elements 175 of the second sub-pixel SP2 into second light. In an embodiment, the first light may be red light having a center wavelength band of 620 nm to 752 nm, the second light may be green light having a center wavelength band of 495 nm to 570 nm, and the third light may be blue light having a center wavelength band of 450 nm to 495 nm.

In an embodiment, the wavelength conversion layer QDL may include a base resin, a wavelength shifter, and a scatterer. The base resin may include a material having high light transmittance. For example, the base resin may include an organic material, such as an epoxy resin, an acrylic resin, a cardo resin, or an imide resin.

The wavelength shifter may convert or shift the wavelength range of the third light having a short wavelength. In an embodiment, the wavelength shifter may be a quantum dot, a quantum rod, or a phosphor. In an embodiment, when the wavelength shifter is a quantum dot, the wavelength shifter may have a specific band gap according to the composition and size of a semiconductor nanocrystalline material. Therefore, the wavelength shifter may absorb incident light and emit light having an intrinsic wavelength. In an embodiment, the wavelength shifter may have a core-shell structure including a core including nanocrystals and a shell surrounding the core.

The scatterer may have a different refractive index from the base resin and may form an optical interface together with the base resin. For example, the scatterer may be a light scattering particle. For example, the scatterer may be a metal oxide particle, such as a titanium oxide ($TiO_2$) particle, a silicon oxide ($SiO_2$) particle, a zirconium oxide ($ZrO_2$) particle, an aluminum oxide ($Al_2O_3$) particle, an indium oxide ($In_2O_3$) particle, a zinc oxide (ZnO) particle, or a tin oxide ($SnO_2$) particle. In another embodiment, the scatterer may be an organic particle, such as an acrylic resin particle or a urethane resin particle.

The scatterer may scatter incident light in a random direction without substantially converting the wavelength of light passing through the wavelength conversion layer QDL. Thus, the length of a path of light passing through the wavelength conversion layer QDL may be increased, such that the color conversion efficiency by the wavelength shifter may be increased.

The light transmitting layer LTL may overlap the third sub-pixel SP3. The light transmitting layer LTL may pass the third light emitted from the light emitting elements 175 of the third sub-pixel SP3 as is. The light transmitting layer LTL may include a material having high light transmittance. For example, the light transmitting layer LTL may include an organic material, such as an epoxy resin, an acrylic resin, a cardo resin, or an imide resin.

The wavelength conversion layer QDL and the light transmitting layer LTL may be disposed to be spaced apart from each other. A first capping layer CPL1 may be disposed on the wavelength conversion layer QDL and the light transmitting layer LTL. The first capping layer CPL1 prevent or substantially prevents moisture or oxygen from permeating into the wavelength conversion layer QDL and the light transmitting layer LTL from the outside. The first capping layer CPL1 may be formed of an inorganic material, for example, silicon nitride, aluminum nitride, zirconium nitride, titanium nitride, hafnium nitride, tantalum nitride, silicon oxide, aluminum oxide, or titanium oxide.

A first light blocking layer BM1 may be disposed in a space between the wavelength conversion layer QDL and the light transmitting layer LTL. The first light blocking layer BM1 may be disposed on the first capping layer CPL1. The first light blocking layer BM1 may overlap the outer bank 430 in the third direction (Z-axis direction). In an embodiment, the first light blocking layer BM1 may include an inorganic black pigment, such as carbon black or an organic black pigment that can block light without transmitting light, or may include an opaque metal material.

A first color filter layer CFL1 may be disposed on the wavelength conversion layer QDL, and a second color filter layer CFL2 may be disposed on the light transmitting layer LTL. For convenience of explanation, it is illustrated in FIG. 17 that the first color filter layer CFL1 passing the first light overlaps the first sub-pixel SP1, and the second color filter layer CFL2 passing the third light overlaps the third sub-pixel SP3. In this case, a third color filter layer (not shown) passing the second light may overlap the second sub-pixel SP2.

A part of the third light emitted from the light emitting elements 175 of the first sub-pixel SP1 may not be converted into the first light by the wavelength shifter of the wavelength conversion layer QDL overlapping the first sub-pixel SP1. The third light that is incident on the first color filter layer CFL1 without being converted by the wavelength conversion layer QDL may not pass through the first color filter layer CFL1. In contrast, the first light converted by the wavelength conversion layer QDL may pass through the first color filter layer CFL1.

A part of the third light emitted from the light emitting elements 175 of the second sub-pixel SP2 may not be converted into the second light by the wavelength shifter of the wavelength conversion layer QDL overlapping the second sub-pixel SP2. The second light that is incident on the third color filter layer (not shown) without being converted by the wavelength conversion layer QDL may not pass through the third color filter layer (not shown). In contrast, the second light converted by the wavelength conversion layer QDL may pass through the third color filter layer (not shown).

The third light emitted from the light emitting elements 175 of the third sub-pixel SP3 may pass through the light transmitting layer LTL and the second color filter layer CFL2 overlapping the third sub-pixel SP3.

The first color filter layer CFL1, the second color filter layer CFL2, and the third color filter layer (not shown) may be disposed to be spaced apart from each other. A second capping layer CPL2 may be disposed on the first color filter layer CFL1, the second color filter layer CFL2, and the third color filter layer (not shown). The second capping layer CPL2 prevents or substantially prevents moisture or oxygen from permeating into the wavelength conversion layer QDL and the light transmitting layer LTL from the outside. The second capping layer CPL2 may be formed of an inorganic material, for example, silicon nitride, aluminum nitride, zirconium nitride, titanium nitride, hafnium nitride, tantalum nitride, silicon oxide, aluminum oxide, or titanium oxide.

A second light blocking layer BM2 may be disposed in a space between the first color filter layer CFL1, the second color filter layer CFL2, and the third color filter layer (not shown). The second light blocking layer BM2 may be disposed on the second capping layer CPL2. The second light blocking layer BM2 may overlap the outer bank 430 in the third direction (Z-axis direction). In an embodiment, the second light blocking layer BM2 may include an inorganic black pigment, such as carbon black or an organic black pigment that can block light without transmitting light, or may include an opaque metal material.

In an embodiment, in order to increase the light transmittance of the transmission area TA, the light transmitting layer LTL, the wavelength conversion layer QDL, the first color filter layer CFL1, the second color filter layer CFL2, the first light blocking layer BM1, and the second light blocking layer BM2 may not be disposed in the transmission area TA. The first capping layer CPL1 and the second capping layer CPL2 may be disposed on the transmission area TA, but the present invention is not limited thereto. The first capping layer CPL1 and the second capping layer CPL2 may also not be disposed in the transmission area TA.

Figure 18:
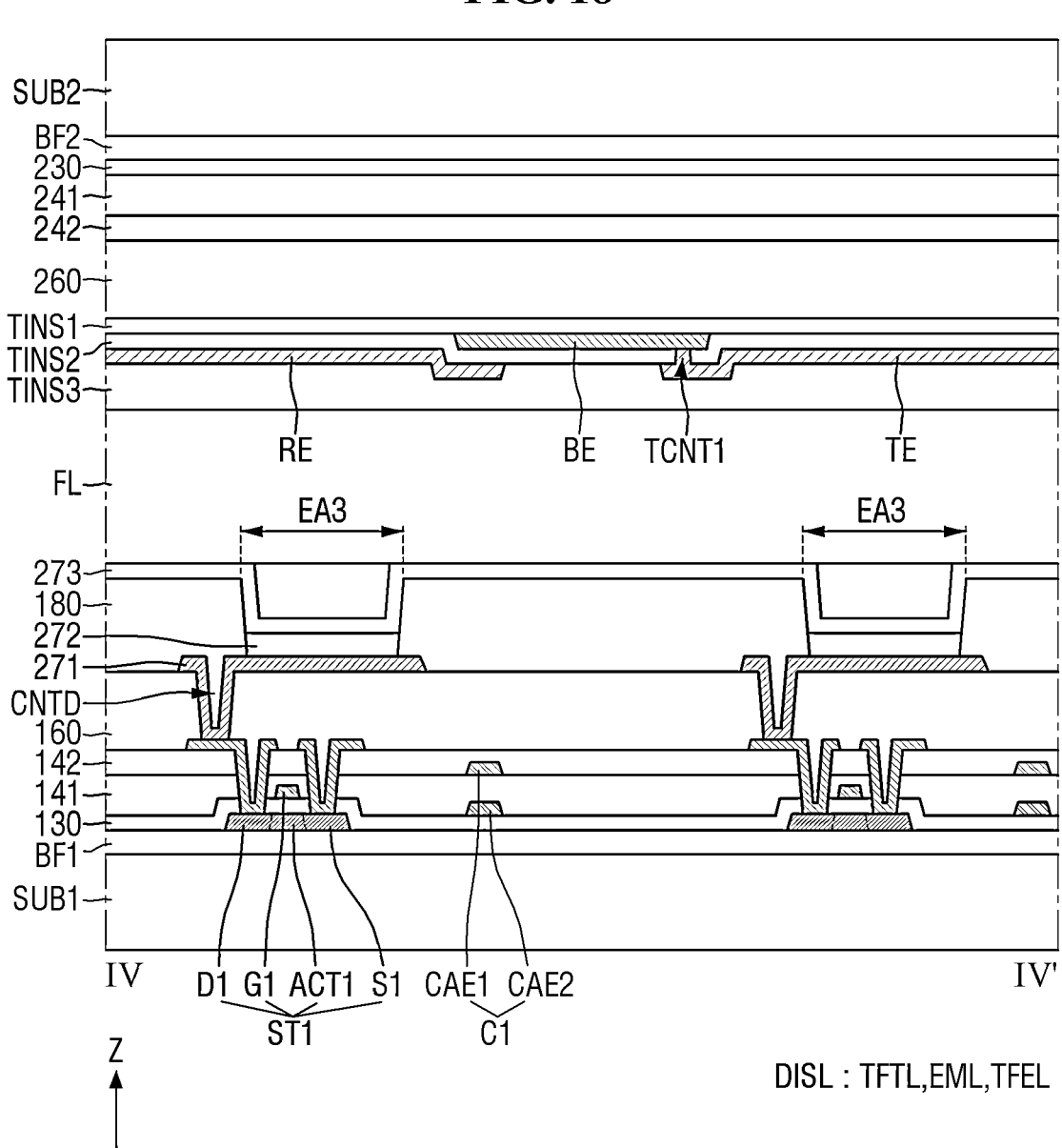
FIG. 18 is a cross-sectional view illustrating another example of a display panel taken along the line IV-IV' of FIG. 13.

FIG. 18 is a cross-sectional view illustrating an example of a display panel taken along the line IV-IV' of FIG. 13.

The embodiment of FIG. 18 is different from the embodiment of FIG. 15 in that a second substrate SUB2, a second buffer film BF2, a second gate insulating film 230, a third interlayer insulating film 241, a fourth interlayer insulating film 242, a second planarization film 260, a first sensor insulating film TINS1, a first connection portion BE1, a second sensor insulating film TINS2, a sensing electrode RE, a driving electrode TE, and a third sensor insulating film TINS3 are stacked from top to bottom. Therefore, a further description of the embodiment of FIG. 18 will be omitted.

Figure 19:
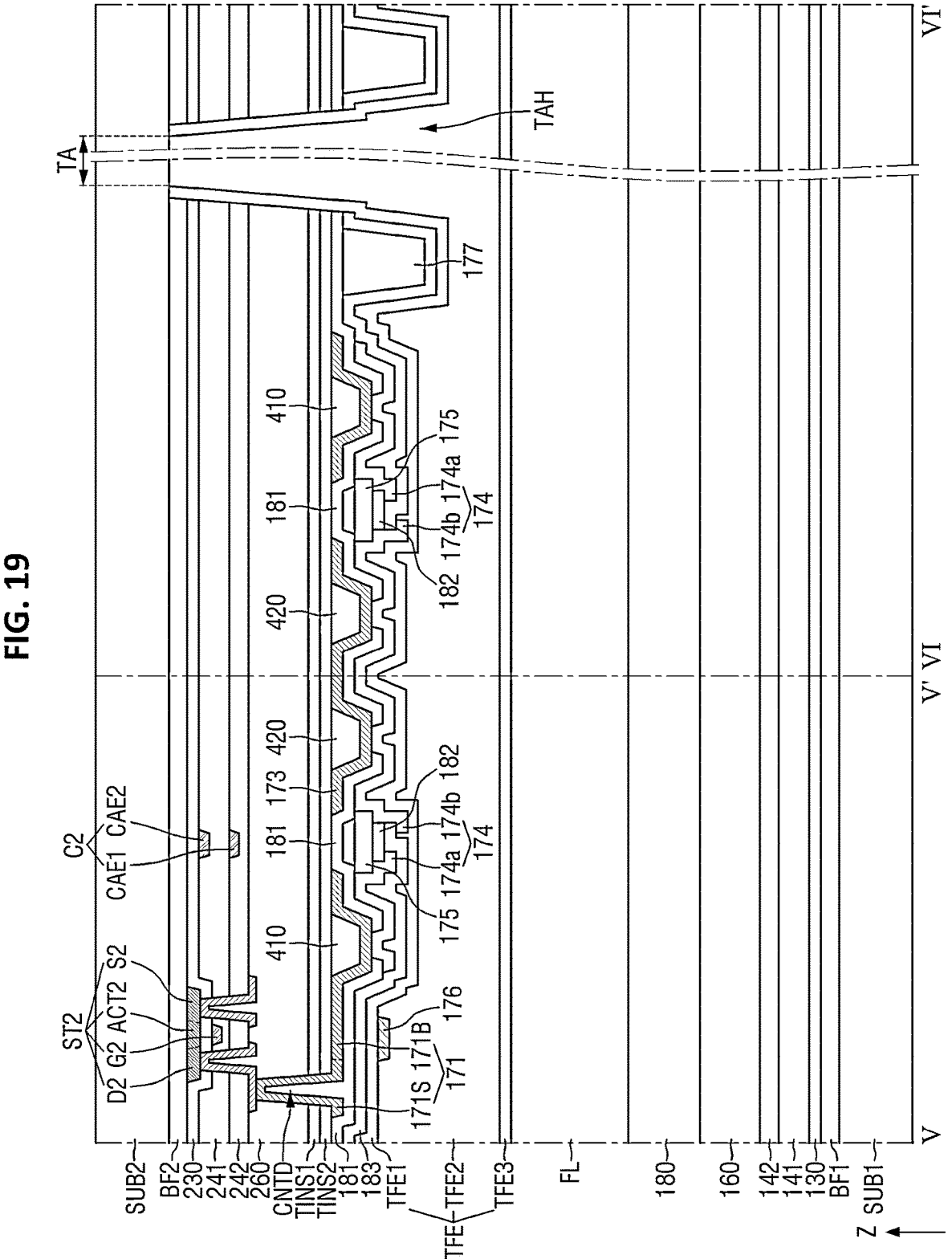
FIG. 19 is a cross-sectional view illustrating another example of a display panel taken along the lines V-V' and VI-VI' of FIG. 14.

FIG. 19 is a cross-sectional view illustrating another example of a display panel taken along the lines V-V' and VI-VI' of FIG. 14.

The embodiment of FIG. 19 is different from the embodiment of FIG. 15 in that a second substrate SUB2, a second buffer film BF2, a second gate insulating film 230, a third interlayer insulating film 241, a fourth interlayer insulating film 242, a second planarization film 260, a first sensor Insulating film TINS1, a second sensor insulating film TINS2, a first inner bank 410, a second inner bank 420, an outer bank 430, a first alignment electrode 171, a second alignment electrode 173, a first insulating film 181, light emitting elements 175, a second insulating film 182, a first contact electrode 174a, a third insulating film 183, a second contact electrode 174b, a sensor electrode SE, and an encapsulation layer TFE are stacked from top to bottom. Therefore, a further description of the embodiment of FIG. 19 will be omitted.

Figure 20:
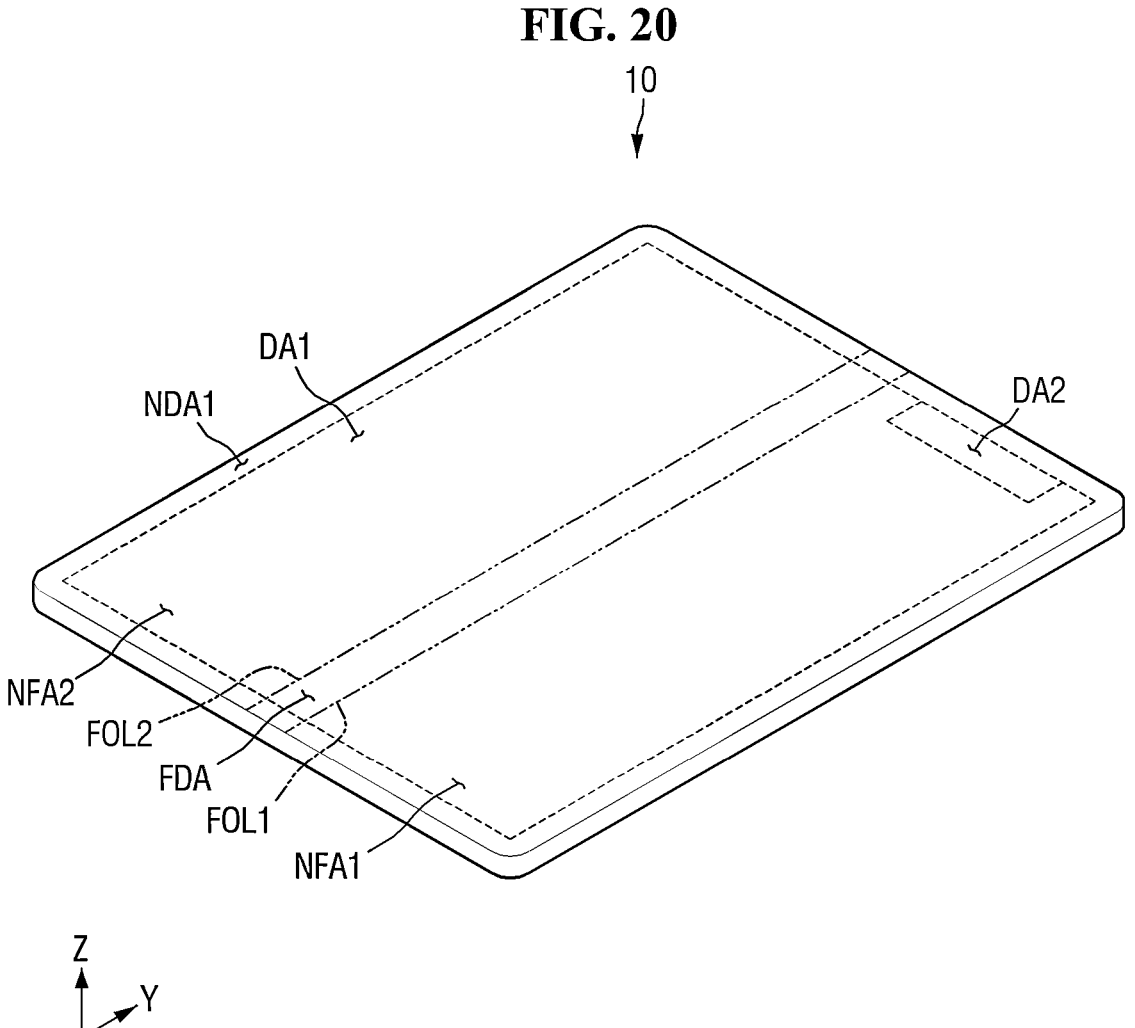
FIGS. 20 to 22 are perspective views of a display device according to another embodiment.
Figure 21:
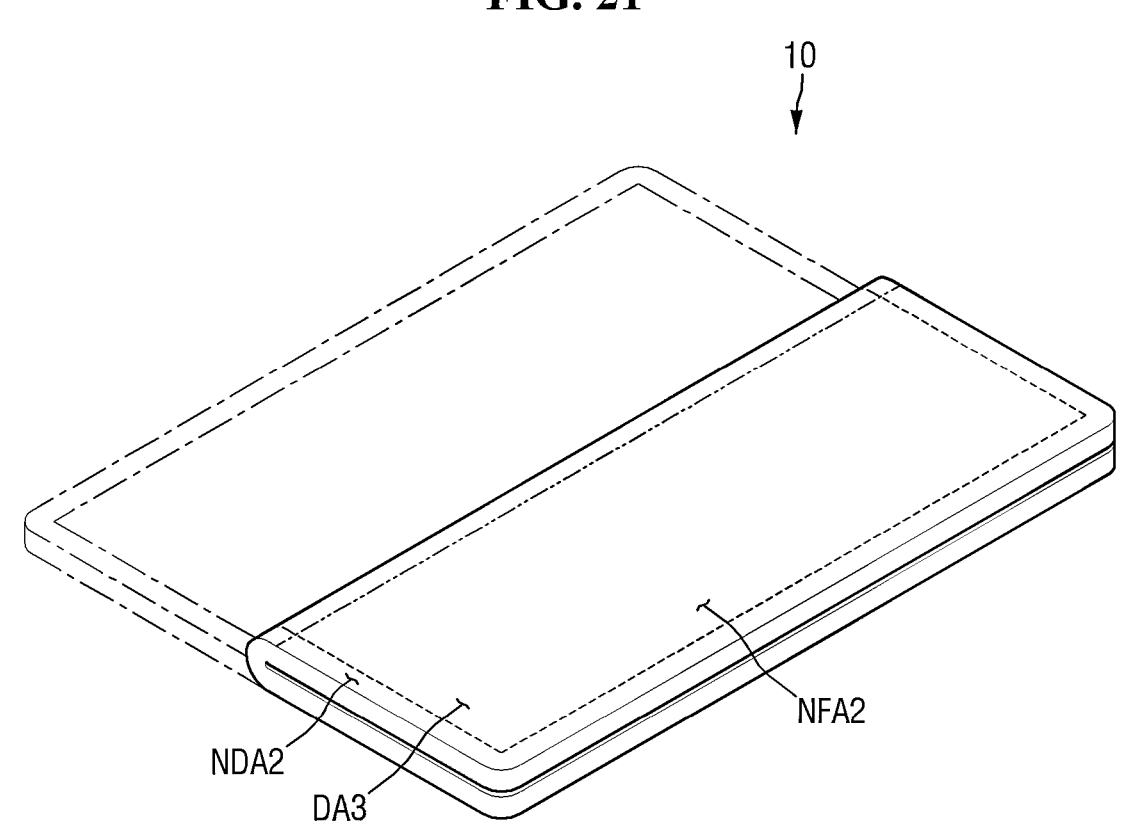
Figure 21:
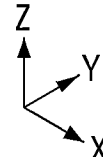
Figure 22:
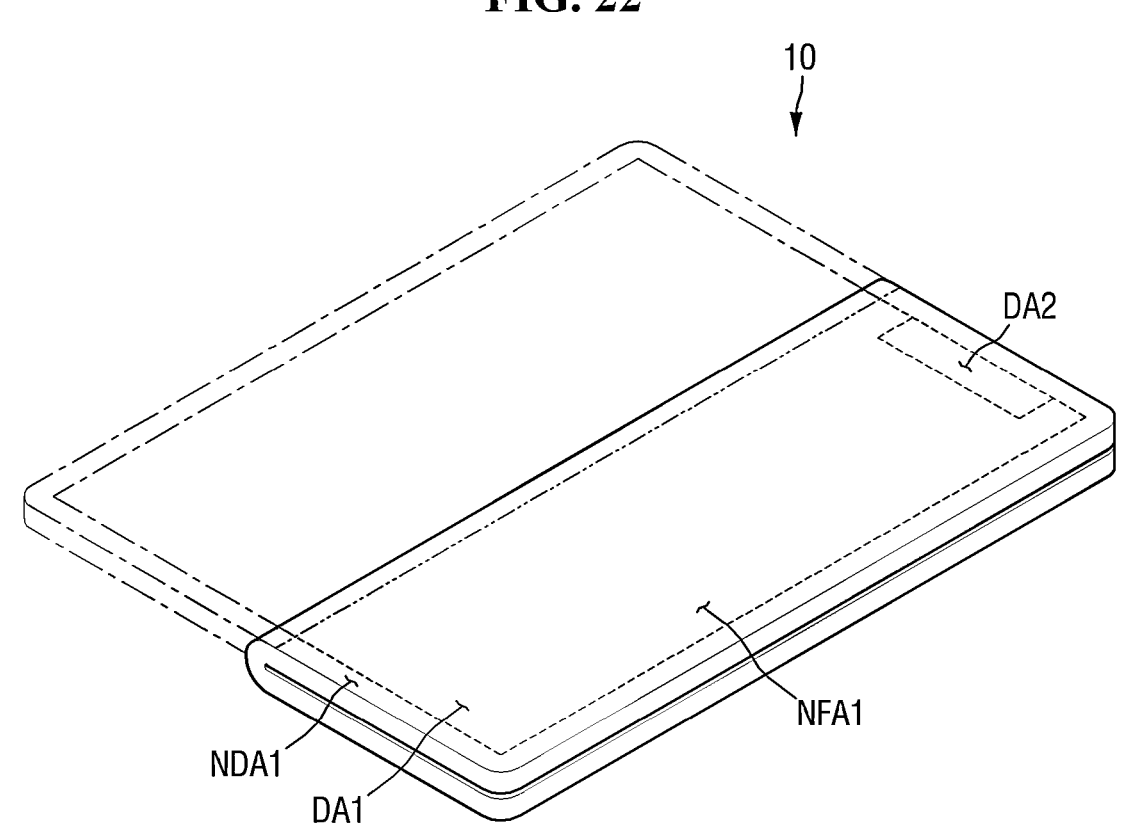
Figure 22:
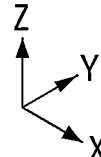

FIGS. 20 to 22 are perspective views of a display device according to another embodiment.

Although it is illustrated in FIGS. 20 to 22 that the display device 10 is a foldable display device folded in the first direction (X-axis direction), the present invention is not limited thereto. The display device 10 may be folded in the second direction (Y-axis direction).

Referring to FIGS. 20 to 22, the display device 10 may maintain both a folded state and an unfolded state. The display device 10 may be folded in an in-folding manner in which the front surface is disposed inward as shown in FIG. 21. When the display device 10 is bent or folded in an in-folding manner, the front surfaces of the display devices 10 may be disposed to face each other. In an embodiment, the display device 10 may be folded in an out-folding manner in which the front surface is disposed outward as shown in FIG. 22. When the display device 10 is bent or folded in an out-folding manner, the back surfaces of the display device 10 may be disposed to face each other.

A first non-folding area NFA1 may be disposed at one side of a folding area FDA, for example, at the right side of the folding area FDA. A second non-folding area NFA2 may be disposed at the other side of the folding area FDA, for example, at the left side of the folding area FDA.

A first folding line FOL1 and a second folding line FOL2 may extend in the second direction (Y-axis direction), and the display device 10 may be folded in the first direction (X-axis direction). Thus, since a length of the display device 10 in the first direction (X-axis direction) may be reduced to approximately half, a user may conveniently carry the display device 10.

However, the extending direction of the first folding line FOL1 and the extending direction of the second folding line FOL2 are not limited to the second direction (Y-axis direction). For example, the first folding line FOL1 and the second folding line FOL2 may extend in the first direction (X-axis direction), and the display device 10 may be folded in the second direction (Y-axis direction). In this case, a length of the display device 10 in the second direction (Y-axis direction) may be reduced to approximately half. In an embodiment, the first folding line FOL1 and the second folding line FOL2 may extend in a diagonal direction of the display device 10 between the first direction (X-axis direction) and the second direction (Y-axis direction). In this case, the display device 10 may be folded in a triangular plane shape.

When the first folding line FOL1 and the second folding line FOL2 extend in the second direction (Y-axis direction), the length of the folding area FDA in the first direction (X-axis direction) may be shorter than the length of the folding area FDA in the second direction (Y-axis direction). Further, the length of the first non-folding area NFA1 in the first direction (X-axis direction) may be longer than the length of the folding area FDA in the first direction (X-axis direction). The length of the second non-folding area NFA2 in the first direction (X-axis direction) may be longer than the length of the folding area FDA in the first direction (X-axis direction).

In an embodiment, the display device 10 may include a first display area DA1, a second display area DA2, a third display area DA3, a first non-display area NDA1, and a second non-display area NDA2. A number of sub-pixels SP1, SP2, and SP3 per unit area in the second display area DA2 may be less than a number of sub-pixels SP1, SP2, SP3 per unit area in the first display area DA1. The number of sub-pixels SP1, SP2, and SP3 per unit area in the second display area DA2 may be less than a number of sub-pixels SP1, SP2, SP3 per unit area in the third display area DA3.

The first display area DA1, the second display area DA2, and the first non-display area NDA1 may be disposed on the front surface of the display device 10. The first display area DA1 may overlap the folding area FDA, the first non-folding area NFA1, and the second non-folding area NFA2. Therefore, when the display device 10 is unfolded, an image may be displayed in the folding area FDA, the first non-folding area NFA1, and the second non-folding area NFA2 of the display device 10.

Although it is illustrated that the second display area DA2 is disposed in the first non-folding area NFA1, the present invention is not limited thereto. The second display area DA2 may be disposed in the second non-folding area NFA2.

The third display area DA3 and the second non-display area NDA2 may be disposed on a back surface of the display device 10. The third display area DA3 may overlap the second non-folding area NFA2. Therefore, when the display device 10 is folded in an in-folding manner as shown in FIG. 21, an image may be displayed in the third display area DA3 disposed on the back surface of the second non-folding area NFA2 of the display device 10. When the display device 10 is folded in an out-folding manner as shown in FIG. 22, an image may be displayed in the first display area DA1 and the second display area DA2 disposed on the front surface of the first non-folding area NFA1 of the display device 10.

Figure 23:
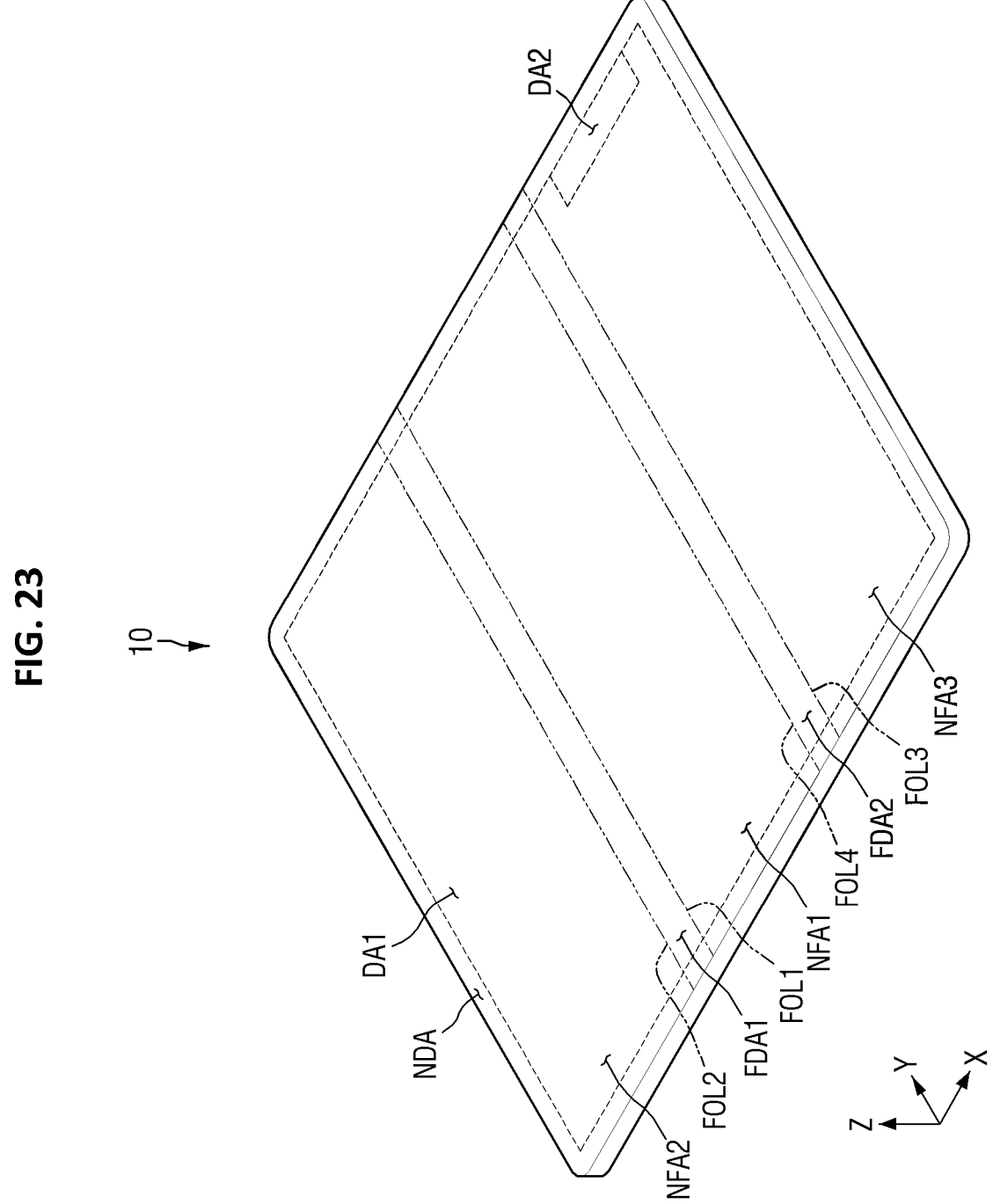
FIGS. 23 and 24 are perspective views of a display device according to another embodiment.
Figure 24:
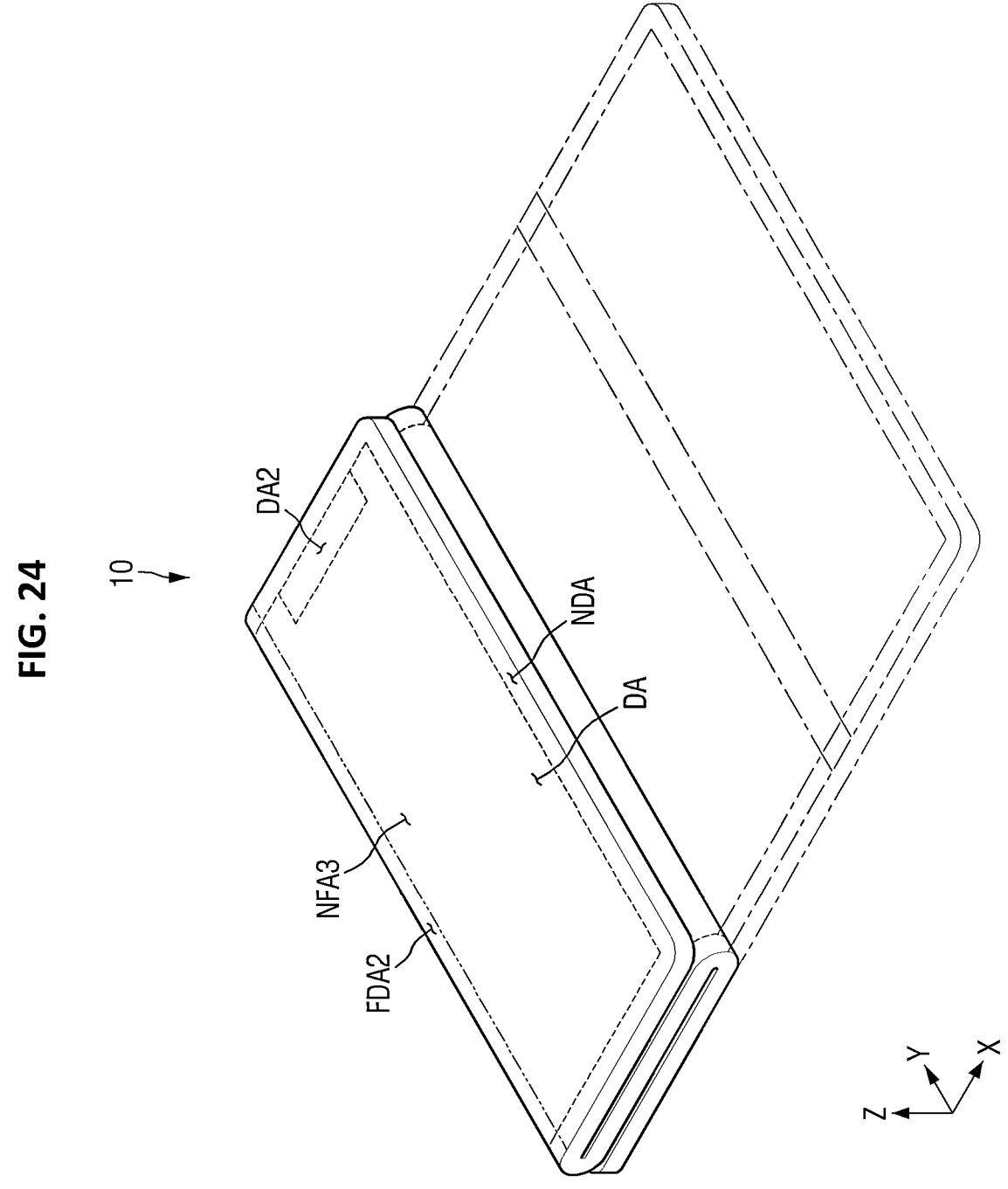

FIGS. 23 and 24 are perspective views of a display device according to another embodiment.

Referring to FIGS. 23 and 24, the display device 10 may maintain both a folded state and an unfolded state. In an embodiment, the display device 10 may be folded in a Z-folding manner as shown in FIG. 24. For example, the front surface of the first non-folding area NFA1 of the display device 10 and the front surface of the second non-folding area NFA2 of the display device 10 may be bent or folded in an in-folding manner so as to face each other. The back surface of the first non-folding area NFA1 of the display device 10 and the back surface of a third non-folding area NFA3 of the display device 10 may be bent or folded in an out-folding manner so as to face each other.

The first non-folding area NFA1 may be disposed at one side of a first folding area FDA1, for example, at the right side of the first folding area FDA1. The second non-folding area NFA2 may be disposed at the other side of the first folding area FDA1, for example, at the left side of the first folding area FDA1. The third non-folding area NFA3 may be disposed at one side of a second folding area FDA2, for example, at the right side of the second folding area FDA2. The first non-folding area NFA1 may be disposed at the other side of the second folding area FDA2, for example, at the left side of the second folding area FDA2.

The first folding line FOL1, the second folding line FOL2, a third folding line FOL3, and a fourth folding line FOL4 may extend in the second direction (Y-axis direction), and the display device 10 may be folded in the first direction (X-axis direction). Thus, a length of the display device 10 in the first direction (X-axis direction) may be reduced to approximately one third, such that it may be convenient for a user to carry the display device 10.

When the first folding line FOL1, the second folding line FOL2, the third folding line FOL3, and the fourth folding line FOL4 extend in the second direction (Y-axis direction), the length of each of the first folding area FDA1 and the second folding area FDA2 in the first direction (X-axis direction) may be shorter than the length in the second direction (Y-axis direction). Further, the length of the first non-folding area NFA1 in the first direction (X-axis direction) may be longer than the length of each of the first folding area FDA1 and the second folding area FDA2 in the first direction (X-axis direction). The length of the second non-folding area NFA2 in the first direction (X-axis direction) may be longer than the length of each of the first folding area FDA1 and the second folding area FDA2 in the first direction (X-axis direction).

The display device 10 may include a first display area DA1, a second display area DA2, and a non-display area NDA. A number of sub-pixels SP1, SP2, and SP3 per unit area in the second display area DA2 may be less than a number of sub-pixels SP1, SP2, SP3 per unit area in the first display area DA1.

The first display area DA1, the second display area DA2, and the non-display area NDA may be disposed on the front surface of the display device 10. The first display area DA1 may overlap the first folding area FDA1, the second folding area FDA2, the first non-folding area NFA1, the second non-folding area NFA2, and the third non-folding area NFA3. Therefore, when the display device 10 is unfolded, an image may be displayed in the first folding area FDA1, the second folding area FDA2, the first non-folding area NFA1, the second non-folding area NFA2, and the third non-folding area NFA3 of the display device 10.

Although it is illustrated that the second display area DA2 is disposed in the third non-folding area NFA3, the present invention is not limited thereto. The second display area DA2 may be disposed in the first non-folding area NFA1 or the second non-folding area NFA2.

When the display device 10 is folded in a Z-folding manner as shown in FIG. 24, an image may be displayed in the first display area DA1 and the second display area DA2 disposed on the front surface of the third non-folding area NFA3 of the display device 10.

Although some example embodiments of the present disclosure have been disclosed for illustrative purposes, those skilled in the art will appreciate that various modifications, additions and substitutions are possible, without departing from the scope and spirit of the disclosure as set forth by the accompanying claims and equivalents thereof.

What is claimed is:

1. A display device, comprising:

a display panel comprising a first display area comprising first sub-pixels to display an image, and a second display area comprising second sub-pixels and a transmission area adjacent to the second sub-pixels; and an optical device overlapping the second display area of the display panel and configured to detect light incident through the transmission area, wherein each of the first sub-pixels comprises a first light-emitting electrode, a second light-emitting electrode on the first light-emitting electrode, and a light-emitting layer between the first light-emitting electrode and the second light-emitting electrode, and wherein each of the second sub-pixels comprises;

a first contact electrode;

a second contact electrode located apart from the first contact electrode;

a light-emitting element between the first contact electrode and the second contact electrode;

an insulating film below the light-emitting element;

a first alignment electrode at a layer below the insulating film; and a second alignment electrode at the layer below the insulating film.

2. The display device of claim 1, wherein the display panel further comprises:

an encapsulation layer on the second light-emitting electrode;

a sensor-insulating film on the encapsulation layer; and a sensor electrode on the sensor-insulating film.

3. The display device of claim 2, wherein each of the second sub-pixels further comprises a thin film transistor comprising a gate electrode, a source electrode, and a drain electrode, wherein the first alignment electrode is electrically connected to the drain electrode of the thin film transistor and contacts the first contact electrode, and wherein the second alignment electrode located is apart from the first alignment electrode and is configured to receive a first driving voltage.

4. The display device of claim 3, wherein the first alignment electrode and the second alignment electrode are on the sensor-insulating film.

5. The display device of claim 3, wherein the sensor electrode, the first alignment electrode, and the second alignment electrode comprise a same material.

6. The display device of claim 1, wherein the display panel comprises:

a second substrate on the second light-emitting electrode; and a thin film transistor on the second substrate and comprising a gate electrode, a source electrode, and a drain electrode, wherein the first alignment electrode is electrically connected to the source electrode or the drain electrode of the thin film transistor and contacts the first contact electrode, and wherein the second alignment electrode is apart from the first alignment electrode and is configured to receive a first driving voltage.

7. The display device of claim 6, further comprising a sensor electrode located apart from the first contact electrode and the second contact electrode.

8. The display device of claim 7, wherein the display panel further comprises another insulating film covering the first contact electrode, and wherein the second contact electrode and the sensor electrode are on the other insulating film.

9. The display device of claim 7, wherein the second contact electrode and the sensor electrode comprise a same material.

10. The display device of claim 6, wherein the display panel further comprises a filling layer between the second substrate and the second light-emitting electrode.

11. The display device of claim 6, wherein the display panel further comprises:

an encapsulation layer on the first contact electrode and the second contact electrode; and a filling layer between the encapsulation layer and the second light-emitting electrode.

12. The display device of claim 6, wherein the display panel further comprises:

an encapsulation layer on the first contact electrode and the second contact electrode;

a wavelength conversion layer on the encapsulation layer; and a color filter layer on the wavelength conversion layer.

13. The display device of claim 1, further comprising a circuit board on a surface of the display panel and mounted with the optical device.

14. The display device of claim 1, wherein the optical device is attached to a surface of the display panel.

15. A display device, comprising:

a first substrate;

a first thin film transistor on the first substrate and comprising a first gate electrode, a first source electrode, and a first drain electrode;

a second thin film transistor on the first substrate and comprising a second gate electrode, a second source electrode, and a second drain electrode;

a first electrode electrically connected to the first source electrode or the first drain electrode of the first thin film transistor;

a light-emitting layer on the first electrode;

a second electrode on the light-emitting layer;

an encapsulation layer on the second electrode;

a sensor electrode on the encapsulation layer;

an insulating film below the encapsulation layer;

a first alignment electrode at a layer below the insulating film and electrically connected to the second source electrode or the second drain electrode of the second thin film transistor;

a second alignment electrode at the layer below the insulating film; and a light-emitting element above the insulating film and electrically connected to the first alignment electrode, wherein the sensor electrode and the first alignment electrode comprise a same material.

* * * * *